(12) United States Patent
Thomas et al.

(10) Patent No.: US 11,574,177 B2
(45) Date of Patent: Feb. 7, 2023

(54) PHOTONIC SYNAPSE BASED ON GRAPHENE-PEROVSKITE QUANTUM DOT FOR NEUROMORPHIC COMPUTING

(71) Applicant: University of Central Florida Research Foundation, Inc., Orlando, FL (US)

(72) Inventors: Jayan Thomas, Orlando, FL (US); Tania Roy, Orlando, FL (US); Sonali Das, Orlando, FL (US); Basudev Pradhan, Orlando, FL (US); Jinxin Li, Orlando, FL (US)

(*) Notice: Subject to any disclaimer, the term of this patent is extended or adjusted under 35 U.S.C. 154(b) by 39 days.

(21) Appl. No.: 17/019,737

(22) Filed: Sep. 14, 2020

(65) Prior Publication Data

US 2021/0081777 A1 Mar. 18, 2021

Related U.S. Application Data

(60) Provisional application No. 62/899,835, filed on Sep. 13, 2019.

(51) Int. Cl.
*G06N 3/067* (2006.01)
*H01L 31/113* (2006.01)
(Continued)

(52) U.S. Cl.
CPC ..... *G06N 3/0675* (2013.01); *H01L 31/03365* (2013.01); *H01L 31/035218* (2013.01); *H01L 31/1136* (2013.01); *H01L 31/18* (2013.01)

(58) Field of Classification Search
CPC ...... G06N 3/0675; G06N 3/049; G06N 3/088; H01L 31/03365; H01L 31/035218;
(Continued)

(56) References Cited

U.S. PATENT DOCUMENTS

2018/0351123 A1* 12/2018 Saliba ...................... C07F 7/24

FOREIGN PATENT DOCUMENTS

| CN | 106653850 | 5/2017 |
| CN | 109037388 | 12/2018 |

OTHER PUBLICATIONS

Wang et al. Hybrid Graphene-Perovskite Phototransistors with Ultrahigh Responsivity and Gain. 2015. Advanced Optical Materials. vol. 3, pp. 1389-1396. (Year: 2015).*
(Continued)

*Primary Examiner* — Hoang-Quan Ho
(74) *Attorney, Agent, or Firm* — Fleit Intellectual Property Law; Jeffrey N. Giunta

(57) ABSTRACT

A phototransistor device to act as an artificial photonic synapse includes a substrate and a graphene source-drain channel patterned on the substrate. A perovskite quantum dot layer is formed on the graphene source-drain channel. The perovskite quantum dot layer is methylammonium lead bromide material. A method of operating the phototransistor device as an artificial photonic synapse includes applying a first fixed voltage to a gate of the phototransistor and a second fixed voltage across the graphene source-drain channel. A presynaptic signal is applied as stimuli across the graphene source-drain channel. The presynaptic signal includes one or more pulses of light or electrical voltage. A current across the graphene source-drain channel is measured to represent a postsynaptic signal.

20 Claims, 19 Drawing Sheets

(51) Int. Cl.
H01L 31/18 (2006.01)
H01L 31/0336 (2006.01)
H01L 31/0352 (2006.01)

(58) Field of Classification Search
CPC ..... H01L 31/1136; H01L 31/18; H01L 51/42; H01L 31/112; H01L 51/0558
See application file for complete search history.

(56) References Cited

OTHER PUBLICATIONS

Bera et al. Graphene Sandwich Stable Perovskite Quantum-Dot Light-Emissive Ultrasensitive and Ultrafast Broadband Vertical Phototransistors. Oct. 16, 2019. ACS Nano. vol. 13, pp. 12540-12552. (Year: 2019).*
Bessonov et al. Compound Quantum Dot-Perovskite Optical Absorbers on Graphene Enhancing Short-Wave Infrared Photodetection. May 30, 2017. ACS Nano 2017. vol. 11. pp. 5547-5557. (Year: 2017).*
Surendran et al. All Inorganic Mixed Halide Perovskite Nanocrystal-Graphene Hybrid Photodetector: From Ultrahigh Gain to Photostability. Jul. 2, 2019. ACS Appl. Mater. Interfaces. vol. 11. pp. 27064-27072. (Year: 2019).*
Xin Huang et al., "Electronic structure and stability of the $Ch_{3}NH_{3}PbBr_{3}$ (001) surface", APS Physics Nov. 22, 2016.
Litao Sun et al., "Migration and Localization of Metal Atoms on Strained Graphene", Physical Review Letters Nov. 2010.
L. Li et al., "Defect energies of graphite: Density-functional calculations", Physical Review B 72, 184109 Nov. 30, 2005.
Jie Ma et al., "Stone-Wales defects in graphene and other planar sp2-bonded materials", Physical Review B 80, 033407 Jul. 17, 2009.
A. A. El-Barbary et al., "Structure and energetics of the vacancy in graphite", Physical Review B 68, 144107 Oct. 15, 2003.
Christopher Eames et al., "Ionic transport in hybrid lead iodide perovskite solar cells", Nature Communications Jun. 24, 2015.
Artem A. Bakulin et al., "Real-Time Observation of Organic Cation Reorientation in Methylammonium Lead Iodide Perovskites", ACS Publications, 3663-3669 Sep. 2, 2015.
Pradeep R. Varadwaj et al., "Why Do Eight Units of Methylammonium Enclose PbI6—Octahedron in Large-Scale Crystals of Methylammonium Lead Iodide Perovskite Solar Cell? An Answer from First-Principles Study" 2008.
Harold Y. Hwang et al., "Nonlinear THz Conductivity Dynamics in P-Type CVD-Grown Graphene", The Journal of Physical Chemistry, ACS Publications 2013.
Jahan M. Dawlaty et al., "Measurement of the optical absorption spectra of epitaxial graphene from terahertz to visible", Appl. Phys. Lett. 93, 131905 Sep. 30, 2008.
Paul A. George et al.,"Ultrafast Optical-Pump Terahertz-Probe Spectroscopy of the Carrier Relaxation and Recombination Dynamics in Epitaxial Graphene", Nano Letters, vol. 8, No. 12, 4248-4251 Jul. 2, 2008.
Xudong Wang et al., "Ultrasensitive and broadband MoS2 photodetector driven by ferroelectrics", arXiv preprint arXiv: 1502.04439 2015.
Tang, Y. et al. A Colloidal-Quantum-Dot Infrared Photodiode with High Photoconductive Gain. Small 14, 1803158 2018.
Gong, X. et al. High-detectivity polymer photodetectors with spectral response from 300 nm to 1450 nm. Science 325, 1665-1667 2009.
Li, F. et al. Ultrahigh Carrier Mobility Achieved in Photoresponsive Hybrid Perovskite Films via Coupling with Single-Walled Carbon Nanotubes. Advanced Materials 29, 1602432 2017.
Wang, Y. et al. Hybrid graphene-perovskite phototransistors with ultrahigh responsivity and gain. Advanced Optical Materials 3, 1389-1396 2015.
Zheng, L. et al. Ambipolar Graphene—Quantum Dot Phototransistors with CMOS Compatibility. Advanced Optical Materials 6, 1800985 2018.
Bera, K. P. et al. Trapped Photons Induced Ultrahigh External Quantum Efficiency and Photoresponsivity in Hybrid Graphene/Metal-Organic Framework Broadband Wearable Photodetectors. Advanced Functional Materials 28, 1804802 2018.
Kufer, D. et al. Hybrid 2D-0D MoS2-PbS quantum dot photodetectors. Advanced materials 27, 176-180 2015.
Rosencher, E. & Vinter, B. Optoelectronics Cambridge University Press. Cambridge, England, 300 2002.
Endres, J. et al. Valence and conduction band densities of states of metal halide perovskites: a combined experimental-theoretical study. The journal of physical chemistry letters 7, 2722-2729 2016.
Liu, X. et al. Graphene nanomesh photodetector with effective charge tunnelling from quantum dots. Nanoscale 7, 4242-4249 2015.
Liao, L. et al. Scalable fabrication of self-aligned graphene transistors and circuits on glass. Nano letters 12, 2653-2657 2011.
Wang, Y. et al. Photonic Synapses Based on Inorganic Perovskite Quantum Dots for Neuromorphic Computing. Advanced Materials 30, 1802883 2018.
Querlioz, D., Bichler, O., Dollfus, P. & Gamrat, C. Immunity to device variations in a spiking neural network with memristive nanodevices. IEEE Transactions on Nanotechnology 12, 288-295 2013.
Marder, E. & Goaillard, J.-M. Variability, compensation and homeostasis in neuron and network function. Nature Reviews Neuroscience 7, 563 2006.
Chan, J. et al. Reducing extrinsic performance-limiting factors in graphene grown by chemical vapor deposition. ACS nano 6, 3224-3229 2012.
Basudev Pradhan et al., "Ultrasensitive and ultrathin phototransistors and photonic synapses using perovskite quantum dots grown from graphene lattice" Science Advances Feb. 12, 2020.
Shuangyi Zhao et al., "Developing near-infrared quantum-dot light-emitting diodes to mimic synaptic plasticity", Science China Materials May 31, 2019.
Shuangyi Zhao et al., "Improving near-infrared quantum-dot light-emitting diodes to mimic synaptic plasticity", Supplementary Information 2019.
Youngbin Lee et al., "High-Performance Perovskite-Graphene Hybrid Photodetector", Advanced Materials, pp. 27, 41-46 2015.
Youngbin Lee et al., "High-Performance Perovskite-Graphene Hybrid Photodetector", Advanced Materials, Supporting Information 2015.
Yan Wang et al., "Photonic Synapses Based on Inorganic Perovskite Quantum Dots for Neuromorphic Computing", Photonic Flash Memory, Advanced Materials 2018.
Yan Wang et al., "Photonic Synapses Based on Inorganic Perovskite Quantum Dots for Neuromorphic Computing", Photonic Flash Memory, Advanced Materials, Supporting Materials 2018.
F. Bonaccorso et al., "Graphene photonics and optoelectronics", Nature Photonics, Review Article Aug. 31, 2010.
Michael C. Brennan et al., "Existence of a Size-Dependent Stokes Shift in CsPbBr3 Perovskite Nanocrystals", ACS Publications, pp. 1487-1488 2017.
Weiqiang Chen et al., "Giant five-photon absorption from multidimensional core-shell halide perovskite colloidal nanocrystals", Nature Communications May 12, 2017.
Wei Deng et al., "Organometal Halide Perovskite Quantum Dot Light-Emitting Diodes", Material Views 2016.
A. K. Geim et al., "The rise of graphene", Nature Materials, pp. 183-191 Mar. 2007.
Chun Xian Guo et al., Graphene Based Materials: Enhancing Solar Energy Harvesting, Advanced Energy Materials 2011.
Son-Tung Ha et al., "Metal halide perovskite nanomaterials: synthesis and applications", Chemical Science 2017.
Yasser Hassan et al., "Structure-Tuned Lead Halide Perovskite Nanocrystals", Advanced Materials, pp. 566-573 2016.
Xin Hu et al., "High-Performance Flexible Broadband Photodetector Based on Organolead Halide Perovskite", Advanced Function Material, pp. 7374-7380 2014.

(56) References Cited

OTHER PUBLICATIONS

Tom C. Jellicoe et al., "Synthesis and Optical Properties of Lead-Free Cesium Tin Halide Perovskite Nanocrystals", Journal of The American Chemical Society 2016.
Gerasimos Konstantatos et al., "Hybrid graphene-quantum dot phototransistors with ultrahigh gain", Nature Nanotechnology May 6, 2012.
Feng Li et al., "Ambipolar solution-processed hybrid perovskite phototransistors", Nature Communications Sep. 8, 2015.
X. Liu et al., "Highly Sensitive and fast Graphene Nanoribbons/ CsPbBr3 Quantum Dots Phototransistor with Enhanced Vertically Metal Oxide Heterostructures", Nanoscale 2013.
Chang-Hua Liu et al., "Graphene photodetectors with ultra-broadband and high responsivity at room temperature", Nature Nanotechnology Mar. 16, 2014.
S.V. Morozov et al., "Giant Intrinsic Carrier Mobilities in Graphene and Its Bilayer", Physical Review Letters Jan. 11, 2008.
R. R. Nair et al., "Fine Structure Constant Defines Visual Transparency of Graphene", Science Mag, vol. 320 Jun. 6, 2008.
Robert A. Nawrocki et al., "A Mini Review of Neuromorphic Architectures and Implementations", IEEE Transactions on Electron Devices, vol. 63, No. 10 Oct. 2016.
Zhijun Ning et al., "Quantum-dot-in-perovskite solids", Nature, vol. 523 Jul. 16, 2015.
Rui Pan et al., "High-Responsivity Photodetectors Based on Formamidinium Lead Halide Perovskite Quantum Dot-Graphene Hybrid", Particle Particle Systems Characterization 2018.
Loredana Protesescu et al., Nanocrystals of Cesium Lead Halide Perovskites (CsPbX3, X = Cl, Br, and I): Novel Optoelectronic Materials Showing Bright Emission with Wide Color Gamut, Nano Letters, ACS Publications 2015.
Rinaldo Raccichini et al., "The role of graphene for electrochemical energy storage", Nature Materials, vol. 14 Mar. 2015.
Biddut K. Sarker et al., "Position-dependent and millimetre-range photodetection in phototransistors with micrometrescale graphene on SiC", Nature Nanotechnology, vol. 12 Jul. 2017.
Frank Schwierz, "graphene transistors", Nature Nanotechology, Review Article May 30, 2010.
Yuchuan Shao et al., "Stable Graphene-Two-Dimensional Multiphase Perovskite Heterostructure Phototransistors with High Gain", Nano Letters, ACS Publications 2017.
Hsinyu Tsai et al., "Recent progress in analog memory-based accelerators for deep learning", Journal of Physics D: Applied Physics, IOP Publishing 2018.
Mark C. Weidman et al., "Monodisperse, Air-Stable PbS Nanocrystals via Precursor Stoichiometry Control", ACS Nano, vol. 8, No. 6, pp. 6363-6371 2014.
Fengnian Xia et al., "Ultrafast graphene photodetector", Nature Nanotechnology, vol. 4 Oct. 11, 2009.
Jun Xing et al., "High-Efficiency Light-Emitting Diodes of Organometal Halide Perovskite Amorphous Nanoparticles", ACS Publication 2016.
Feng Zhang et al., "Brightly Luminescent and Color-Tunable Colloidal CH 3 NH 3 PbX 3 (X = Br, I, Cl) Quantum Dots: Potential Alternatives for Display Technology", ACS Nano Mar. 2015.
Yongzhe Zhang et al., "Broadband high photoresponse from pure monolayer graphene photodetector", Nature Communications May 7, 2013.
Xiao-Liang Zhang et al., "Enhanced nonlinear optical properties of graphene-oligothiophene hybrid material", Optics Express, vol. 17, No. 26 Dec. 16, 2009.
Yong Sheng Zhao et al., "Low-Dimensional Nanomaterials Based on Small Organic Molecules: Preparation and Optoelectronic Properties", Advanced Materials, pp. 2859-2876 2008.
Hsinyu Tsai et al., "Recent progress in analog memory-based accelerators for Deep Learning", Author Submitted Manuscript 2018.
Sungho Kim et al., "Pattern Recognition Using Carbon Nanotube Synaptic Transistors with an Adjustable Weight Update Protocol", ACS Nano 2017.
Yusheng Wang et al., "Hybrid Graphene-Perovskite Phototransistors with Ultrahigh Responsivity and Gain", Material Views, Advanced Optical Material 2015.
Li Zheng et al., "Ambipolar Graphene-Quantum Dot Phototransistors with CMOS Compatibility", Ambipolar Phototransistors, Advanced Optical Material 2018.
Krishna Prasad Bera et al., "Trapped Photons Induced Ultrahigh External Quantum Efficiency and Photoresponsivity in Hybrid Graphene/Metal-Organic Framework Broadband Wearable Photodetectors", Wearable Photodetectors, Advanced Function Material, pp. 1804802-1804802 2018.
He Tian et al., "High Performance 2D Perovskite/Graphene Optical Synapses as Artificial Eyes" 2018.
Shuchao Qin et al., "A light-stimulated synaptic device based on graphene hybrid", 2D Materials 4, IOP Publishing 2017.
Shilei Dai et al., "Light-stimulated Synaptic Devices Utilizing Interfacial Effect of Organic Field-effect Transistors", ACS Applied Materials & Interfaces, ACS Publications Jun. 7, 2018.
Minkyung Lee et al., Brain-Inspired Photonic Neuromorphic Devices using Photodynamic Amorphous Oxide Semiconductors and their Persistent Photoconductivity, Advanced Materials, pp. 1700951-1700951 2017.
Youngbin Lee et al., "High-Performance Perovskite-Graphene Hybrid Photodetector", Material Views, Advanced Material, Pges 27, 41-46 2015.
Wei Geng et al., "Effect of surface composition on electronic properties of methylammonium lead iodide perovskite", Journal of Materiomics Apr. 23, 2015.

* cited by examiner

| Active Materials | R (A/W) | D* (Jones) | EQE (%) | λ (nm) | Thickness (nm) |
|---|---|---|---|---|---|
| FAPbBr$_3$-graphene | $1.15 \times 10^5$ | | $3.42 \times 10^7$ | 520 | |
| 2D perovskite-graphene | $1 \times 10^5$ | | | 532 | 125 |
| MAPbI$_{3-x}$Cl$_x$-CNT | $1 \times 10^4$ | $3.7 \times 10^{14}$ | | | 400 |
| MAPbBr$_2$I-graphene | $6 \times 10^5$ | | | | 250 |
| PbS QD-graphene | $2.6 \times 10^4$ | $5.5 \times 10^{12}$ | | 637 | |
| MOF-graphene | $1.25 \times 10^6$ | $6.9 \times 10^{14}$ | $5 \times 10^8$ | 325 | 140 |
| CsPbBr$_3$-graphene nanoribon | 800 | $7.5 \times 10^{14}$ | $5 \times 10^5$ | 512 | 30 |
| PbS QD-MoS$_2$ | $6 \times 10^5$ | $5 \times 10^{11}$ | | 980 | 40-60 |
| PbS QD-Graphene | $5 \times 10^7$ | $7 \times 10^{13}$ | | 600 | 100 |
| MAPbBr$_3$ film-Graphene | 180 | $1 \times 10^9$ | $5 \times 10^4$ | 400-800 | >100 |
| MAPbBr$_3$ PDs grown on graphene | $1.4 \times 10^8$ | $4.72 \times 10^{15}$ | $4.08 \times 10^{10}$ | 430-440 | < 20 |

PHOTONIC SYNAPSE BASED ON GRAPHENE-PEROVSKITE QUANTUM DOT FOR NEUROMORPHIC COMPUTING

STATEMENT REGARDING FEDERALLY SPONSORED RESEARCH

This invention was made with Government support under National Science Foundation CAREER: ECCS-1351757 and ECCS-1845331. The U.S. Government has certain rights in this invention.

CROSS-REFERENCE TO RELATED APPLICATIONS

This application is related to the following prior U.S. Provisional Patent Application No. 62/899,835 entitled "Photonic Synapse Based On Graphene-Perovskite Quantum Dot For Neuromorphic Computing" with inventors Jayan THOMAS et al., filed on Sep. 13, 2019, the entire disclosure of the aforementioned application is hereby incorporated into the present application by reference in its entirety.

BACKGROUND

The present application relates generally to neuromorphic computing and more specifically to an electronic device controlled by light to produce photonic synapses and neuromorphic computing.

Graphene emerged as a popular material for electronics and optoelectronics applications due to its broad spectral bandwidth, excellent carrier transport properties with very high mobility (electron mobility >15000, $cm^{-2} \cdot V^{-1} \cdot s^{-1}$), exceptional stability in ambient conditions, and outstanding flexibility. A plethora of composites and devices have been developed for applications in energy harvesting and storage, photodetectors, and transistors. However, a single layer of graphene absorbs only 2.3% of incident visible light. Moreover, to date, the responsivity of graphene photodetectors has been limited to about $10^{-2}$ $AW^{-1}$. These limitations critically impede the use of graphene in optoelectronic and photonic devices. On the other hand, organic-inorganic halide PQDs have risen as attractive materials for optoelectronic devices due to their bandgap tunability across the visible spectrum, high photoluminescence quantum yield, narrow emission spectrum, and high extinction coefficients. The drawback is that their charge transport is far inferior to that of graphene.

BRIEF DESCRIPTION THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which:

FIG. 13 is a table showing the performance summary of previously report graphene-QD-base phototransistors.

DETAILED DESCRIPTION

Figure 1:
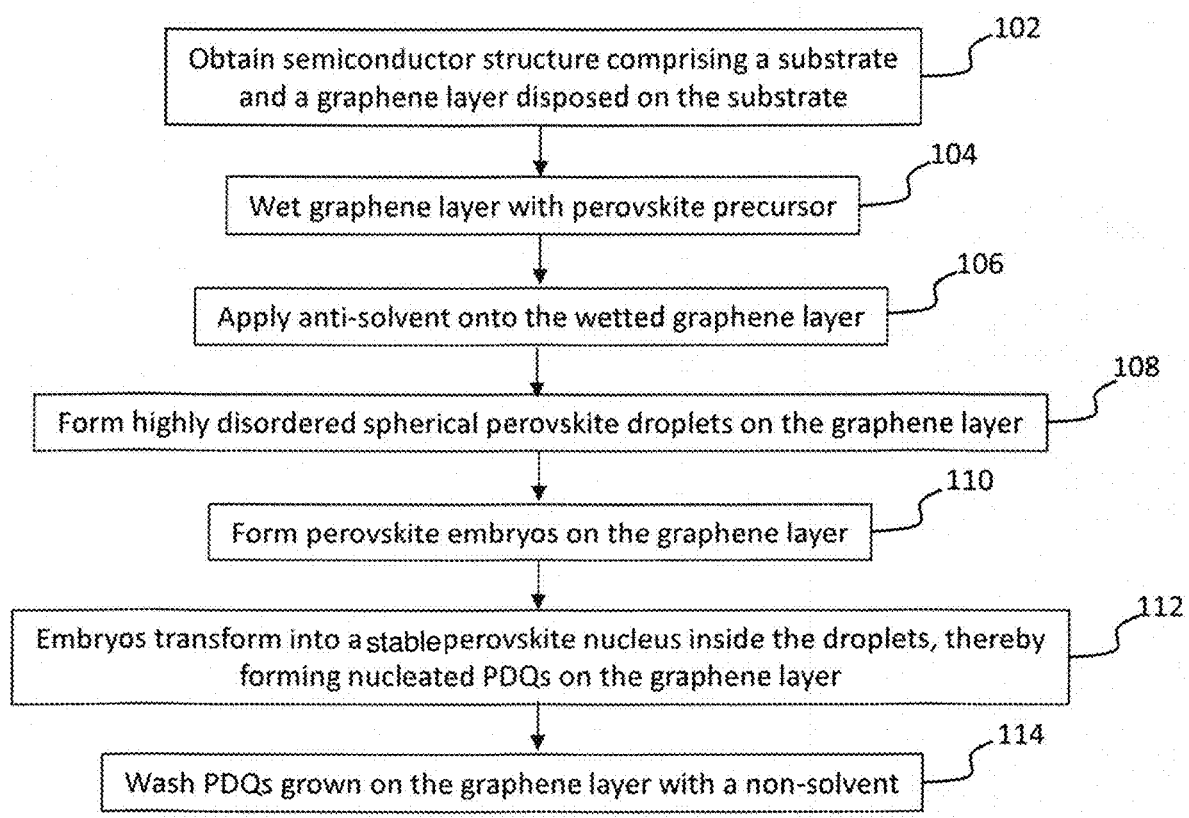
FIG. 1 is an operational flow diagram illustrating an example of one process for forming a synthesized graphene perovskite quantum dot (G-PQD) hybrid material (G-PQD superstructure) in accordance with some embodiments.

PQDs in the form of bilayers or heterostructures have been pursued to improve the performance of graphene-based phototransistors. For example, phototransistors comprised of a 2D perovskite thin film deposited on graphene by spin coating have exhibited responsivity of approximately $10^5$ $AW^{-1}$ at 530 nanometers (nm). Also, spin coated formamidinium lead halide PQDs on a graphene layer have been demonstrated to have a photoresponsivity of $1.15\times10^5$ $AW^{-1}$ at 520 nm. PQDs films prepared as the active layer of a phototransistor by various deposition methods typically have a minimum thickness of at least 100 nm. The highest photoresponsivity reported to date for a graphene-based phototransistors $10^7$ $AW^{-1}$, measured with an infrared phototransistor prepared by spin coating lead sulfide (PbS) quantum dots on CVD-grown graphene. Growing PQDs on a graphene layer to enhance charge transfers between the two moieties constitutes an entirely new direction for electronic and optoelectronic device applications.

As described in greater detail below, the strong photogeneration efficiency of methylammonium lead bromide perovskite quantum dots (PQDs) can be exploited by growing PQDs on a single layer of graphene by a defect-mediated process to form a hybrid graphene-PQD (G-PQD) superstructure. One or more embodiments can be extended to other 2D materials, including transition metal dichalcogenides and other heterostructures, which opens the door to a new class of high-performing superstructure materials for many electronic and optoelectronic applications. The rationale for designing this hybrid superstructure stems from the ability of PQDs to absorb light and generate charge carriers, and from the high conductivity of the graphene matrix, which enables the transport of generated carriers across the active layer of a device, such as a phototransistor, formed with the G-PQD superstructure material of one or more embodiments. A highly enhanced charge transfer can be obtained due to the overlap of the π-electron clouds of PQDs and graphene. The implementation of this thin superstructure in a phototransistor geometry results in a photoresponsivity of at least $1.4\times10^8$ $AW^{-1}$ at 430 nm and a specific detectivity (D*) of $4.72\times10^{15}$ Jones, which is the best responsivity and detectivity across similar devices to date. This is very promising for the development of highly efficient optoelectronic materials for high-speed communications, sensing, ultra-sensitive cameras, and high-resolution imaging and displays. In addition, the G-PQD superstructure of one or more embodiments, behaves as a photonic synapse that mimics crucial characteristics of its biological equivalent with unique optical potentiation and electrical habituation function, which is critical for pattern recognition. This enables the building of a hardware unit for the neuromorphic architecture to mimic the human brain functionalities, which is critical for applications such as pattern recognition.

Growing PQDs from Graphene Lattice

Figure 2:
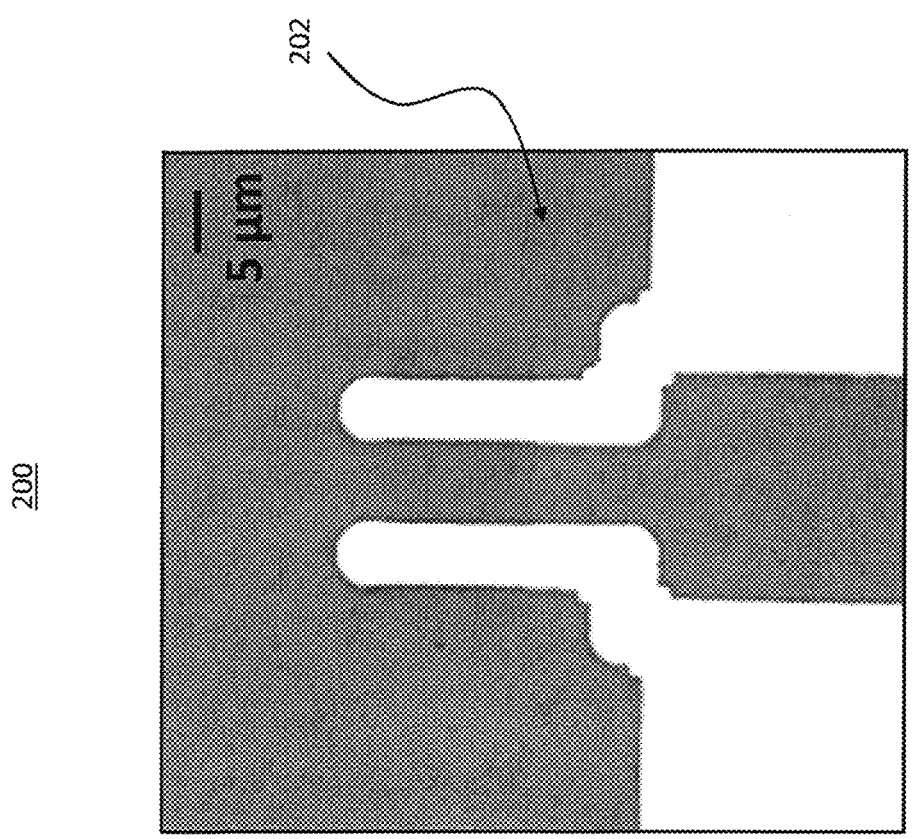
FIG. 2 is optical image illustrating an example of a graphene field-effect-transistor (FET) in accordance with some embodiments.

FIG. 1 is an operational flow diagram illustrating one example of a process/method 100 for forming a synthesized G-PQD hybrid material in accordance with one or embodiments. Although the process 100 depicted in FIG. 1 is with respect to a bottom-gated field-effect-transistor (FET) structure, the G-PQDs of one or more embodiments can also be used with other types of FETs as well. In one embodiment, the process 100 for growing PQDs is initiated directly on the highly active defect sites of graphene monolayer surfaces to form the superstructure. The process 100 is initiated at block 102 in response to obtaining a semiconductor structure comprising a substrate and a graphene layer/sheet disposed on the substrate. The substrate, in one embodiment, can comprise a material such as (but not limited to p+ silicon) having a thermally grown $SiO_2$ dielectric formed thereon. The substrate, in one example, has a thickness of 300 nanometers (nm) although other thickness are applicable as well. The semiconductor structure comprising the substrate and graphene layer can be fabricated as follows. A layer of graphene on copper foil can be wet transferred to the $SiO_2$ substrate via one or more methods. A graphene channel is patterned using photolithography and etched in oxygen plasma. Drain/source electrodes are patterned using photolithography and a material such as nickel (e.g., 50 nm) is deposited using an electron beam evaporation process. An optical image 200 of a representative graphene FET 202 on $SiO_2$/Si substrate is shown in FIG. 2.

The graphene layer (channel) at block 104 is wetted with a perovskite precursor to initiate seeding by dipping the graphene layer into the precursor. In one embodiment, the precursor comprises Methylammonium lead bromide ($CH_3NH_3PbBr$) quantum dots (PQDs) and can be prepared by the ligand-assisted re-precipitation (LARP) method. The LARP method can be used to fabricate PQDs with very high photoluminescence quantum yield. LARP mixes polar and non-polar solvents to synthesize PQDs at room temperature. This strategy is sufficiently mature to control the size and morphology of the PQDs. For example, PQDs with a diameter below 4 nm can be been grown and exhibit enhanced quantum confinement. In one example, the precursor preparation can include solubilizing the precise ratio of $PbBr_2$ (0.2 mmol) and $CH_3NH_3Br$ (0.16 mmol) salts in 5 ml of DMF. This can be followed by the addition of 50 μl of butylamine and 500 μl of oleic acid to the perovskite precursor solution, which can then be ultrasonicated for given period of time (e.g., 10 minutes).

Figure 3:
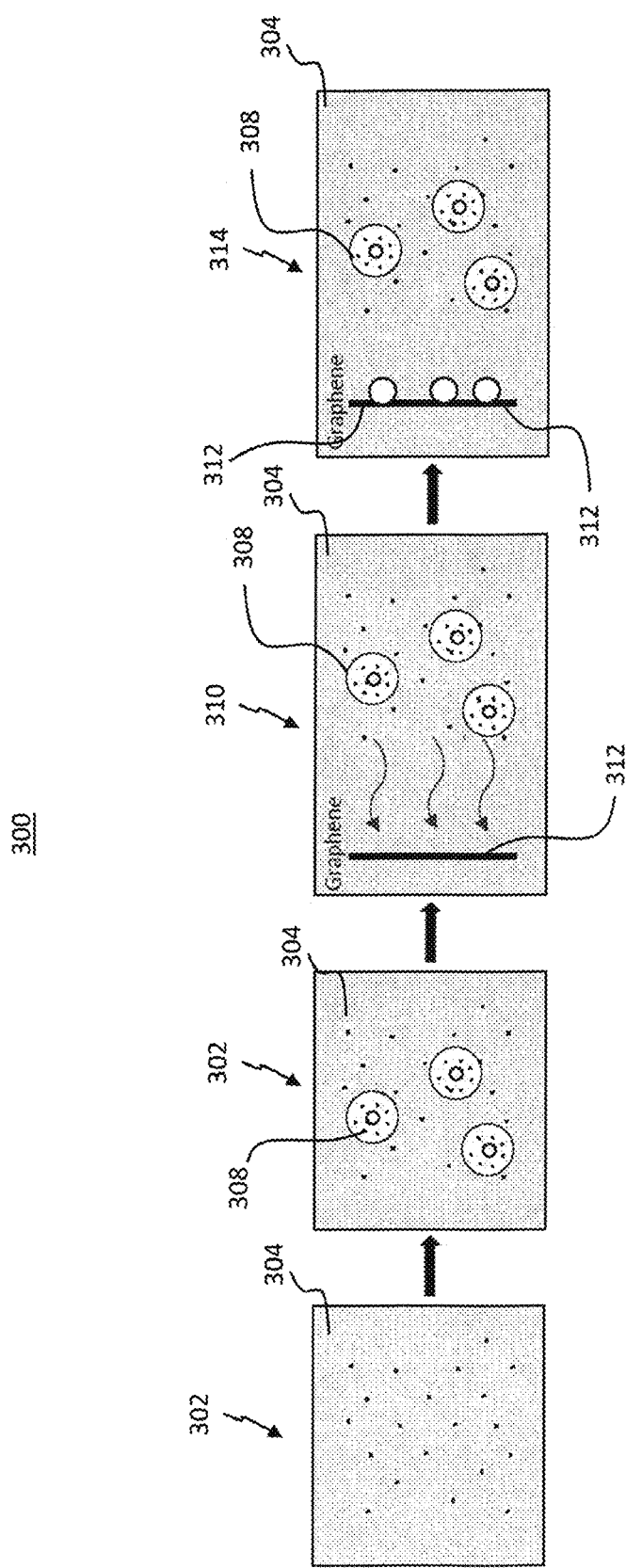
FIG. 3 is an illustrative example of nucleation and growing PQDs on a graphene layer in accordance with some embodiments.

An anti-solvent, such as toluene, at block 106 is added to the precursor solution after a period of time (e.g., 30 minutes) while the graphene layer is dipped in the precursor solution. Crystal growth (PQD growth) then subsequently follows for given period of time (e.g., 60 mins). The growth of PQDs on a graphene layer can be explained by a two-step growth model. First, at block 108, when a large volume of the anti-solvent toluene is injected onto the precursor that is coating the graphene, a highly disordered spherical perovskite droplet with high concentration and large density fluctuations is formed on graphene as well as in the toluene solution due to the excess of precursors. Next, at block 110, perovskite embryos form on the graphene sheet as well as in the toluene solution under saturation conditions. The perovskite embryos at block 112 transform into a stable perovskite nucleus inside the droplet beyond the critical size required for crystal formation. With their high Gibbs surface free energy, the defects in the graphene provide preferential sites for the embryo formation, thereby nucleating the PQDs. It is also possible that collisions between the disordered droplet and the graphene layer leads to contact nucleation, as shown in FIG. 3 discussed below. Electrostatic attraction with the graphene layer may also contribute to the growth via strong immobilization of the clusters formed. The proximity to the critical point of nucleation decreases the Gibbs surface free energy barrier for crystallization and consequently increases the rate of nucleation. The PQDs grown on the graphene sample, in one embodiment, can then be continuously washed at block 114 with a nonsolvent for a given time period, such as 10 minutes, to remove any PQDs that have not grown but, instead, just adsorbed on the graphene surface. The samples can then be dried using, for example, $N_2$ gas. The resulting structure is referred to herein as a "G-PQD superstructure", "synthesized G-PQDs hybrid material" or "GPQDs".

FIG. 3 shows an illustrative example of nucleation and growing PQDs on a graphene layer. In this example, during a first phase 302, anti-solvent solution 304 is applied to the precursor solution. During a second phase 306, precursor droplets 308 are formed resulting from the anti-solvent solution 304 being added to the precursor solution. During a third phase 310, the droplets 308 collide with the graphene layer 312. Then, during a fourth phase 314, the collision of the droplets 308 with the graphene layer 312 causes nucleation to occur, thereby growing PQDs 316 on the graphene layer 312 as well as embryo formation.

Figure 4:
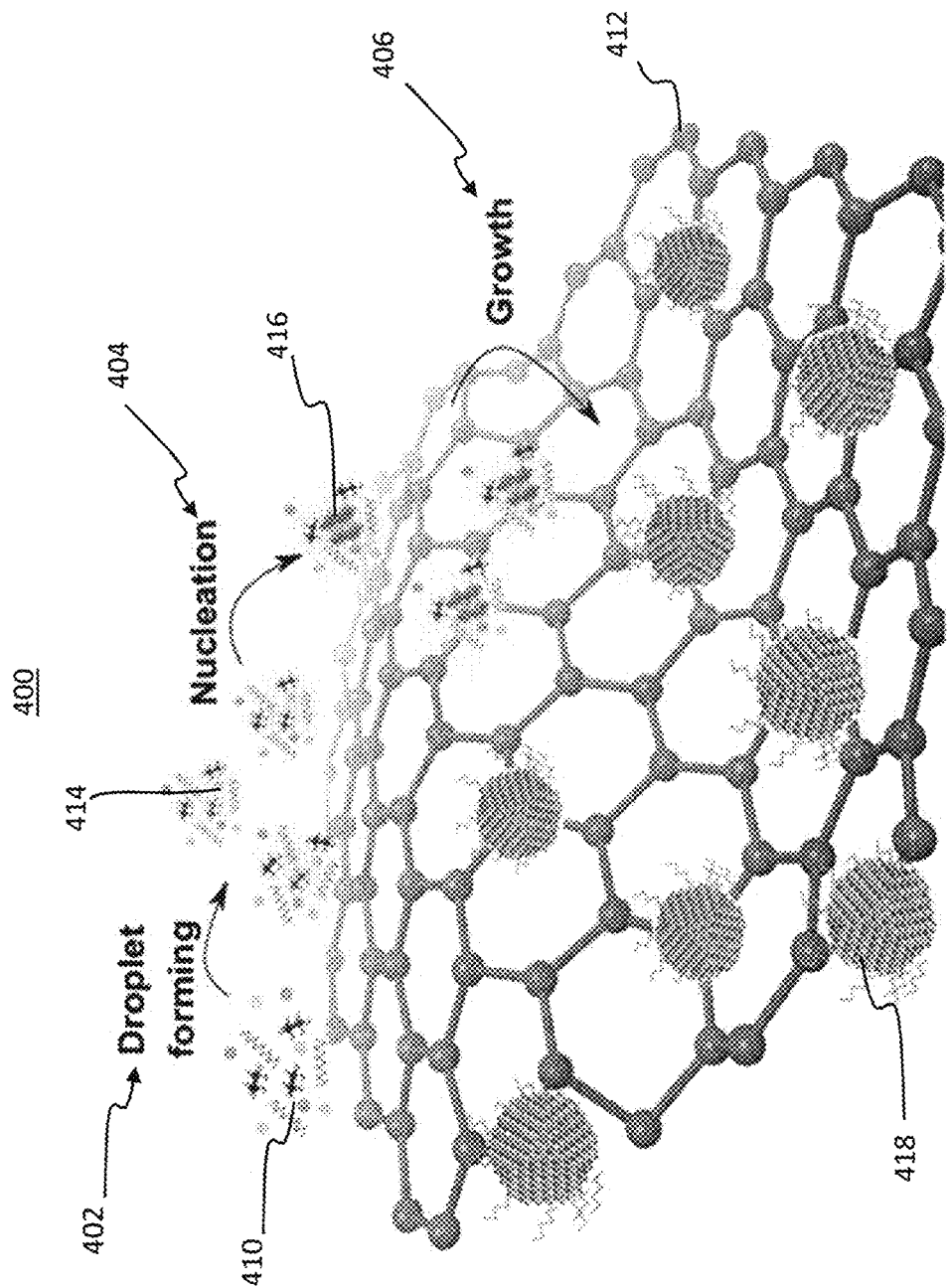
FIG. 4 is an illustrative example of forming the synthesized G-PQD hybrid material (G-PQD superstructure) in accordance with some embodiments.

FIG. 4 shows an illustrative example of forming the synthesized G-PQD hybrid material (G-PQD superstructure) 400 of one or more embodiments. In this example, the precursor/anti-solvent solution 402 is applied to the graphene layer 404. Then, during the droplet forming phase 406, highly disordered spherical perovskite droplets 408 are formed on the graphene layer 404 as well as in the precursor/anti-solvent solution 402. Perovskite embryos form within the droplets 408 and, during the nucleation phase 410, transform into a stable perovskite nucleus 412 inside the droplet 408. During the growth phase 414, PQDs 416 grow on the graphene layer 404 from the nucleated perovskite embryos 412.

Figure 5:
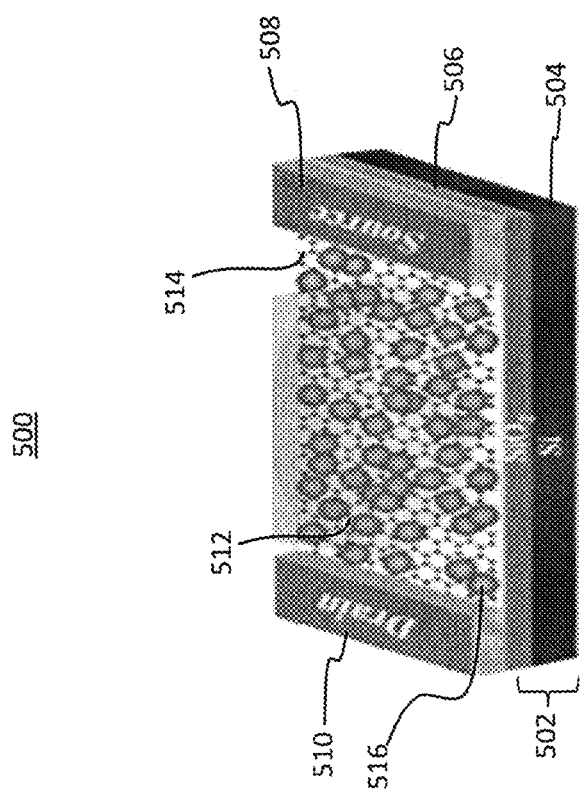
FIG. 5 is a cross-sectional view of a semiconductor device, such as a phototransistor, comprising the G-PQD hybrid material (G-PQD superstructure) in accordance with some embodiments.

FIG. 5 shows one example of a semiconductor device 500, such as a phototransistor, comprising the synthesized G-PQD hybrid material according to one or more embodiments. In the example shown in FIG. 5, the semiconductor device 500 comprises a substrate 502. The substrate, in at least some embodiments, comprises a silicon layer 504 and a $SiO_2$ 506 layer formed thereon. A source layer 508 and a drain layer 510 are formed on the substrate 502. The semiconductor device 500 further comprises a G-PQD superstructure material (synthesized G-PQD hybrid material) 512 formed as the channel of the device 500. The G-PQD superstructure 512 comprises a graphene layer 514 having G-PQDs 516 grown thereon. It should be understood that embodiments are not limited to the semiconductor structure 500 illustrate in FIG. 5, as other semiconductor structures are applicable as well. FIG. 1a of U.S. Provisional Patent Application No. 62/899,835 (herein "USPPA '835"), from which priority is claimed, illustrates another example of a device comprising the G-PQD superstructure of one or more embodiments and an application thereof (e.g., neuromorphic photonic synapse).

When the synthesized G-PQD hybrid material 400 of one or more embodiments was analyzed by transmission electron microscopy (TEM), the analysis indicated the grown PQDs are randomly distributed on the graphene layers, with a denser population along the graphene edges. The defect sites or dangling bonds on the edges may favor nucleation sites for the PQDs. The PQDs grown on graphene by heterogeneous nucleation were found to have an average diameter of 3.1 nm with a size deviation of 0.5 nm for a 30 min growth process. The PQDs were found to have a spherical shape over the graphene surface and an interplanar spacing of 0.27 nm, which corresponds to the (201) lattice plane in PQDs. Fast Fourier transform (FFT) analysis confirmed that the zone axis of these QDs is along the (201) direction, which is consistent with associated x-ray (XRD) results. The growth of PQDs on the graphene layer was further confirmed by additional TEM imaging, where lattice distortions were clearly observed. These are attributed to the stress developed in the graphene lattice upon PQD crystal growth. The spectra of pristine PQDs and G-PQDs 400 both exhibited similar major peaks at 3.3°, 4.4°, 6.5°, 9.0° and 15.4°, corresponding to (011), (101), (201), (141), and (100) crystal planes, respectively. This confirms the crystallinity of the structures formed in G-PQDs 400. The low peak intensities observed in the case of G-PQDs 400 is attributed to the low density of PQDs on the single-layer graphene compared to the density of the pure PQDs solution drop casted for the measurements. The TEM images and XRD spectra graph discussed herein are illustrated in FIGS. 1b-1e of USPPA '835.

The binding energies in the pristine PQDs and G-PQDs 400 were evaluated using X-ray photoelectron spectroscopy (XPS). In pristine PQDs (see FIG. S2 of USPPA '835), the XPS spectra mostly coincided with the signature peaks of the bulk methylammonium lead bromide perovskite, especially for Pd-4f and Br-3d energy states. Binding energies at 67.58 eV and 68.62 eV correspond to inner and surface ions, respectively. The ratio of intensity of the two bands suggests that Br bonds are more prevalent in the core of the QDs than at their surface. The N-1s binding energies confirm the existence of two chemical environments of the N element with bands at 398.21 eV and 400.86 eV, corresponding to N—C and amine (—$NH_2$) ions, respectively. The Pb-4f spectrum also exhibited two peaks positioned at 137.77 eV and 142.63 eV, corresponding to the levels of Pb-4$f_{7/2}$ and Pb-4$f_{5/2}$ associated with $Pb^{2+}$ in $PbBr_3^-$, respectively. The C-1s spectrum with peaks at 284.03 eV and 284.43 eV confirms the presence of C—H/C—C and C—N bonds, respectively. All core-level XPS spectra corresponding to Pb-4f, Br-3d, C-1s, and N-1s (see FIG. S1 of USPPA '835) exhibited an increase in binding energies in G-PQDs 400 compared to PQDs. The C-1s spectrum of G-PQDs 400 also reveals $sp^2$ bonding with the apparition of a peak at 284.09 eV. These results are indicative of binding between PQDs and the graphene layers, as evident from the fact that non-bound bilayer systems consisting of $CsPbBr_3$ QDs/graphene oxide composite and organic molecule-graphene interfaces previously characterized with XPS showed no signs of change in binding energies.

The effect of growing PQDs on the graphene sheet was further investigated with Raman spectroscopy (see FIG. 1g of USPPA '835). Pristine graphene exhibited the signature of a high-quality single layer, with a band ~1580 $cm^{-1}$ corresponding to the stretching of the C—C bond in the plane, which is in agreement with the change in binding energies observed with XPS. To test the attachment of PQDs on a graphene surface, the inventors drop casted a film of pre-prepared PQDs on graphene. The Raman spectra of graphene were not affected in this case. However, in G-PQDs 400, the shift of a G-band to a lower wavelength was accompanied by the apparition of a D-band at ~1340 cm$^{-1}$. The D-band in graphene has been attributed to a zone boundary mode ($A_{1g}$) usually found at an armchair edge of graphene sheets. The results thus suggest that the growth of the PQDs creates a sufficiently large density of local armchair edges in the graphene sheets to be detected by Raman spectroscopy.

Optical absorption is an important parameter for a highly sensitive photodetector. The grown G-PQD film 400 absorbs in the visible wavelength region with a maximum of 434 nm and a secondary band maximum of 451 nm (see FIG. 2a of USPPA '835). These are attributed to two different sizes of PQDs grown on the graphene layer. The 434 nm band corresponds to the smaller PQDs. The photoluminesence (PL) spectrum exhibits peaks at 462 nm and 479 nm corresponding to a bandgap of 2.6-2.7 eV. The steady state PL intensity decreased in G-PQDs superstructures 400 compared to pristine PQDs film, which is attributed to additional charge transfer pathways provided by graphene in addition to the intrinsic radiative channels for excited state charge transfer. Together, these results suggest that the G-PQD layer 400 is a potential candidate for high-performing phototransistors detecting at blue illumination.

To further understand the photo-physical properties of the material, the excited state dynamics of the G-PQDs superstructure 400 were probed with time-correlated single photon counting (TCSPC). While the PQDs on a glass substrate exhibited a biexponential decay similar to previously reported literature with an average fluorescence decay time of 2747 ns, G-PQDs 400 exhibited an average fluorescence decay time of 749 ns (see FIG. 2b of USPPA '835). Single layer graphene has displayed similar quenching effects with previously reported perovskite nanoparticles and PQD on single layer graphene deposited by spin coating methods. The longer fluorescence lifetimes observed in this study along with reported low exciton binding energy of perovskite materials could indicate a photoinduced electron transfer mechanism as the predominant pathway for the quenching effects. Overall, the observed PL quenching is an indication of fast charge transfer in G-PQDs superstructure 400 due to high carrier mobility in graphene and the direct contact between the two components.

Figure 6:
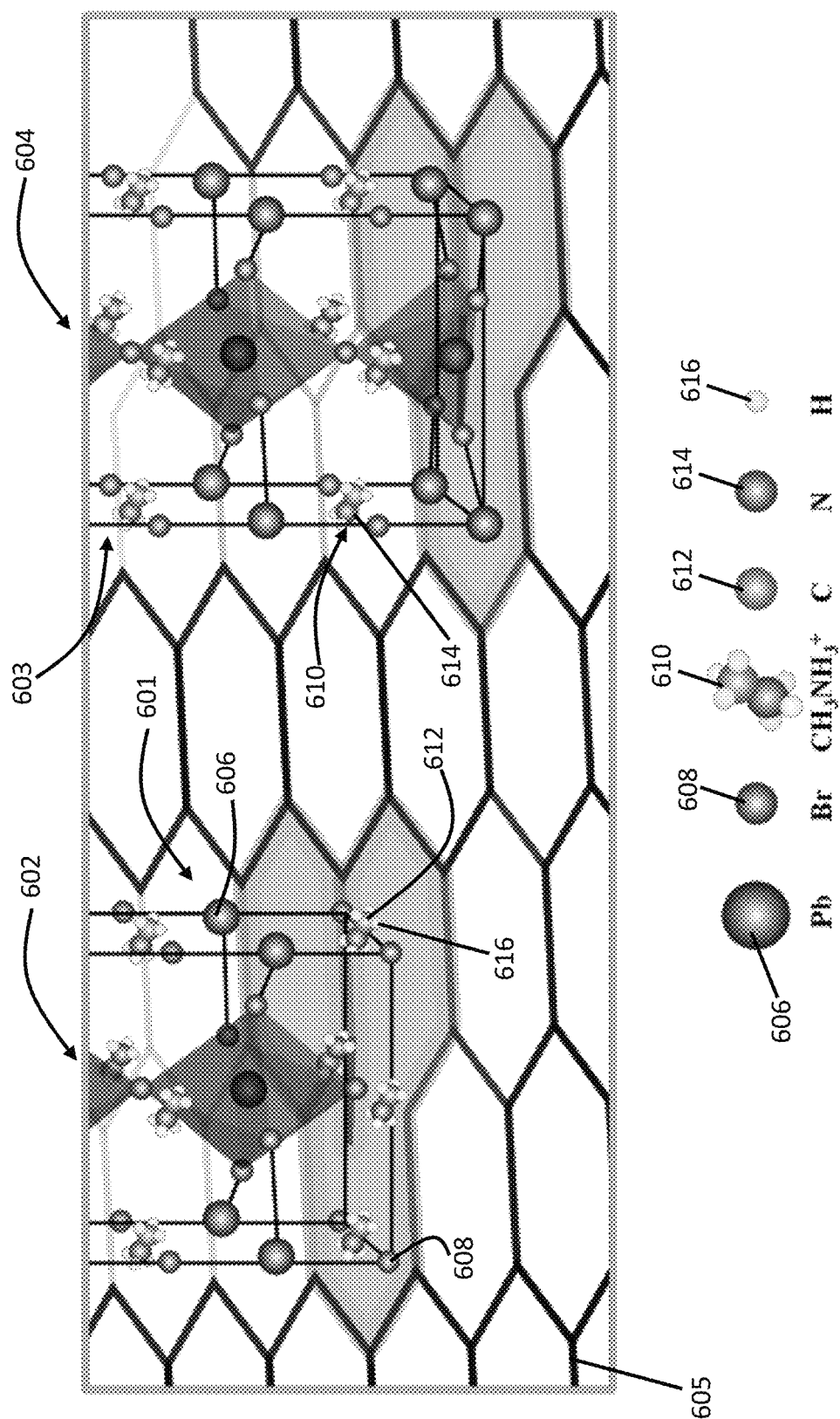
FIG. 6 shows a schematic representation of PQDs grown on graphene surface via Methylammonium Bromide termination (MABr-T)) and Lead Bromide termination (PbBr-T) in accordance with some embodiments.
Figure 11:
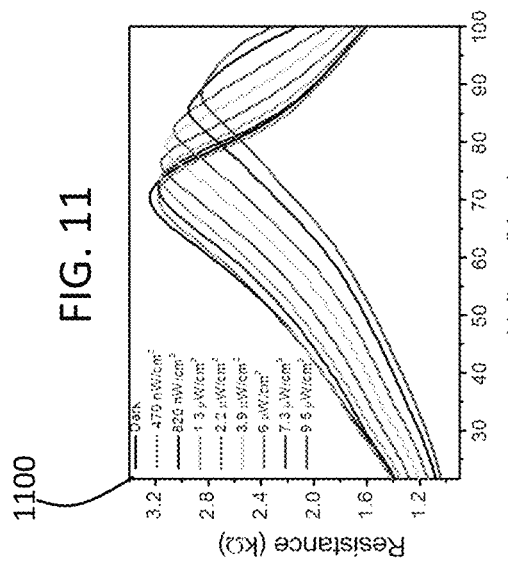
FIG. 11 is a graph of resistance as a function of back gate voltage ($V_{BG}$) under different illumination intensity at a given drain-source voltage $V_{DS}$ of 500 mV in accordance with some embodiments.

The growth of PQDs on graphene may facilitate charge transfer through π-π electron interactions between PQDs and the sp$^2$ hybridized graphene layer. Previously reported Density Functional Theory (DFT) studies confer some insights into the electronic properties of the two different termination planes in perovskite crystals. Because heterogeneous nucleation of PQDs likely initiates at defect sites of graphene, it is important to understand the surface termination of perovskite crystals. According to DFT calculations, two possible terminations may occur during perovskite crystal formation of $CH_3NH_3PbI_3$: 1) MAI termination (MA ion and I atoms in the plane) or 2) $PbI_2$ termination (Pb atoms and I atoms in the plane). It is demonstrated that Pb atoms in the $PbI_2$-termination plane and I atoms in the MAI-termination plane comprise unhybridized p orbitals. Similar to $CH_3NH_3PbI_3$, there can be two possible terminations in the $CH_3NH_3Br$ PQDs[50]: 1) $CH_3NH_3Br$ termination (MA ion and Br atoms in the termination plane), or 2) $PbBr_2$-termination (Pb atoms and Br atoms in the termination plane), as shown in FIG. 6. For example, FIG. 6 shows PQDs 601, 603 grown on graphene surface 605 via, Methylammonium Bromide termination (MABr-T)) 602 and Lead Bromide termination (PbBr-T) 604 comprising Pb 606; Br 608, $CH_3NH_3$ 610, C 612, N 614, and H 616). As such, the Pb-6p orbitals and Br-4p orbitals on the terminated planes of PQDs can overlap with the unhybridized 2p orbitals of the carbon atoms of graphene. As the efficacy of charge transfers at the interface of PQD and graphene depends on the overlap of the π-orbitals, the grown PQDs can transfer charges more efficiently than other heterostructure prepared by deposition techniques like spin coating. However, the Methyl ammonium ion ($CH_3NH_3^+$) does not directly take part in the charge transfer because it is caged in the corner sharing eight $PbI_6^{-4}$ octahedra and is only hydrogen bonded to Iodine atoms.

Highly Sensitive Ultrathin Phototransistors

Figure 7:
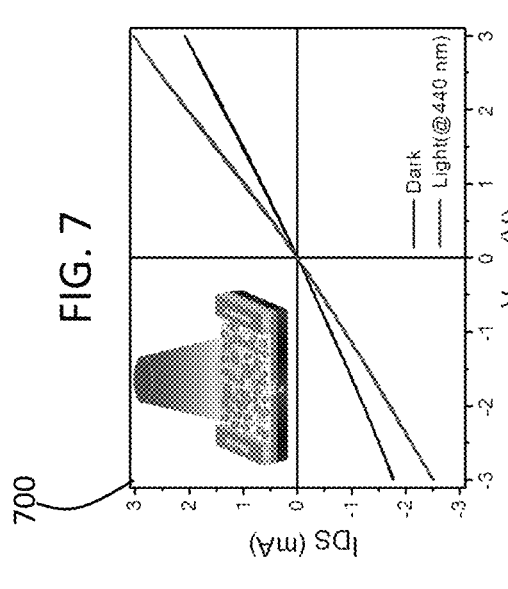
FIG. 7 is a graph of drain current ($I_{DS}$) vs drain voltage ($V_{DS}$) characteristic of a phototransistor comprising the G-PQD superstructure of FIG. 4 under the dark and illumination intensity of 440 nm monochromatic light with zero gate voltage G-PQD synaptic device in accordance with some embodiments.

The aforementioned characterizations imply a direct growth of PQDs on the graphene surface, which facilitate an efficient charge transfer from PQDs to graphene. The charge generation and transfer efficiency of the G-PQD superstructure 400 of one or more embodiments was evaluated in a phototransistor geometry fabricated on a silicon dioxide/silicon wafer (FIG. 2). In this configuration, graphene constitutes a carrier transport channel and PQDs play the role of the photo-absorbing material. The pristine graphene used for this experiment was hole dominated. $I_{DS}$-$V_{DS}$ (drain current $I_{DS}$ vs drain voltage $V_{DS}$) curves were obtained for the current-voltage characteristics of the phototransistor in dark conditions and under 440 nm illumination with zero gate voltage, as shown in graph 700 of FIG. 7. These $I_{DS}$-$V_{DS}$ curves indicate an ohmic behavior both for the forward and reverse bias, without any trace of hysteresis. A significant enhancement in photocurrent is observed with an increase in illumination intensity. The phototransistor responsivity (R) is calculated as the ratio of the photocurrent density $J_{ph}$ to incident light intensity $L_{light}$:

$$R = J_{ph}/L_{light}$$

Figure 8:
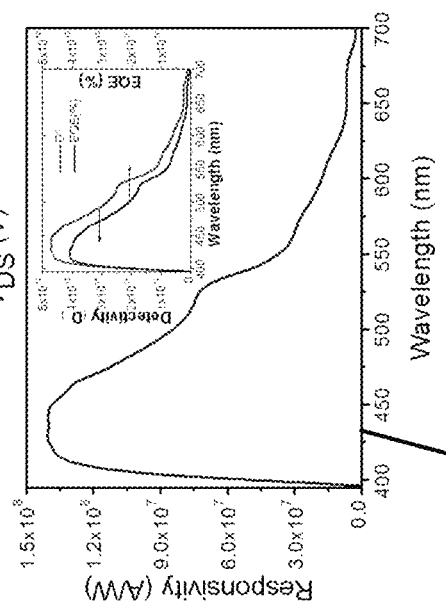
FIG. 8 is a graph of Spectral responsivity of a phototransistor comprising the G-PQD superstructure of FIG. 4 in accordance with some embodiments.

FIG. 8 shows a graph 800 representing R over the 300-700 nm range. The photoresponsivity reaches a maximum at 430 nm, which matches with G-PQDs absorbance peak, but slowly decreases in the 430-700 nm range. The G-PQDs superstructure phototransistor 400 shows a photoresponsivity of $1.4 \times 10^8$ A/W, which is among the highest reported responsivity to the best of our knowledge. The device, which was prepared by drop casting PQDs on graphene, shows a photoresponsivity of only $6 \times 10^6$ A/W. As the photocurrent generation in a single layer graphene is very negligible due to ultrafast recombination and very low absorption, the major contribution to photogeneration arises from PQDs.

The figure of merit of the phototransistor, detectivity (D*), is calculated based on the equation:

$$D^* = RA^{0.5}/(2qI_d)^{0.5} \quad (2),$$

where q is the absolute value of the electronic charge ($1.6 \times 10^{-19}$ Coulombs), A is the effective area of the device and Id is the dark current. D* is the measure of the minimum optical power differentiated from the noise caused by shot noise from the dark current, which is the major contribution to the noise as compared to the other two noises, Johnson noise, and thermal fluctuation "flicker" noise.

A photodetectivity (D*) of $4.72 \times 10^{15}$ Jones and EQE (%) of $4.08 \times 10^{10}$ were determined for the G-PQDs superstructure 400 of one or more embodiments when illuminated with 430 nm light (see FIG. 3b of USPPA '835). The superstructure 400 of one or more embodiments, shows much enhanced sensitivity compared to other reported phototransistors, as shown in the table 1300 of FIG. 13. In most semiconductor phototransistors, three transition modes occur: band-to-band, impurity-to-band and quantum well transitions. Band-to-band and impurity-to-band transitions are favored in one or more embodiments, since photon energy is absorbed by valence electrons of the PQDs when the energy of the incident photon is higher than the band gap of PQDs. As a result, a photogenerated free charge carrier is generated. As the PQDs are grown on graphene, the charge transfer from PQDs to graphene is very fast compared to a mixed or drop-casted/spin-coated sample. On the other hand, when the incident photons have less energy than the bandgap of PQDs, as band to band transition is not feasible, only electrons from the impurity levels can absorb the photons and get excited to the conduction band. This is followed by a transfer of electrons to graphene, leading to a very small photocurrent.

Figure 9:
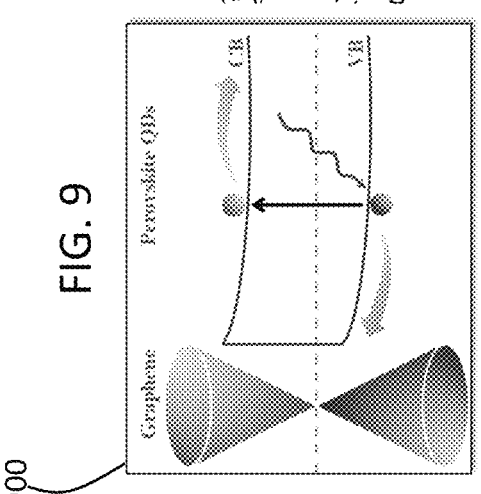
FIG. 9 is a graph of photoexciatation for a phototransistor comprising the G-PQD superstructure of FIG. 4 in accordance with some embodiments.
Figure 10:
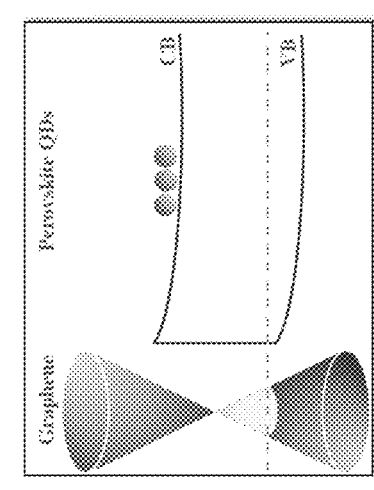
FIG. 10 is a graph of photogating for a phototransistor comprising the G-PQD superstructure of FIG. 4 in accordance with some embodiments.

Schematics 900, 1000 of the energy bands for the G-PQDs superstructure 400 are shown in FIG. 9 and FIG. 10. The work function of a single layer pristine graphene is around 4.56±0.04 eV, whereas the Fermi level of PQD is 5 eV[70]. When PQDs are grown on the graphene sheet, the work function mismatch between the two materials leads to a built-in field developed at the interface of graphene and PQDs to align the Fermi levels. The Dirac point ($V_{Dirac}$), obtained from the drain-source resistance as a function of gate voltage under dark and illumination conditions observes a drastic shift from above 80V to 70V. This is attributed to the charge transfer from the PQDs to the graphene layer (FIG. 2). The resistance as a function of back gate voltage ($V_{BG}$) under different illumination intensities at a fixed drain-source voltage ($V_{DS}$) of 500 mV was also obtained (see FIG. 3e of USPPA '835). As the light intensity increases, the $V_{Dirac}$, at which the device 500 comprising the G-PQD superstructure 400 resistance reaches its maximum value, shifts towards a higher voltage due to the photogating effect. Under illumination, the PQDs absorb the photon energy and generate electron-hole pairs, which are effectively dissociated at the graphene/PQDs interface by the built-in field. The photogenerated holes are transported to the graphene from PQDs and the photogenerated electrons remain on the PQDs. The photo-gating effect, induced by the accumulated electrons in the PQDs, produces a hole current in the graphene through capacitive coupling (similar to the application of a negative voltage on graphene) and shifts the $V_{Dirac}$ of the G-PQDs superstructure to a higher $V_{BG}$.

Figure 14:
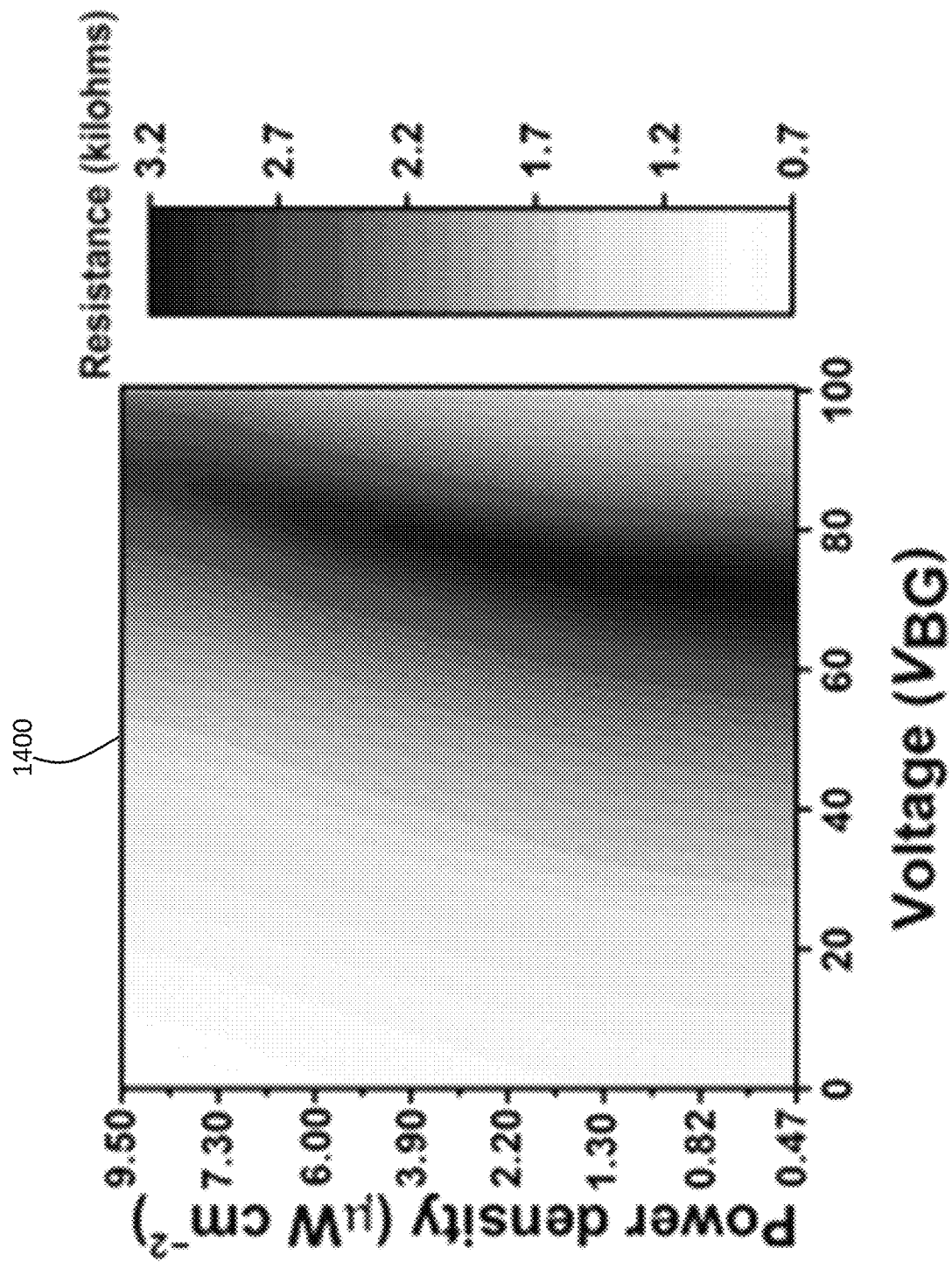
FIG. 14 is a graph showing a two-dimension plot of the G-PQD superstructure resistance as a function of optical power in accordance with some embodiments.

Furthermore, when $V_{BG}<V_{Dirac}$, the carrier transport in the graphene channel is hole dominant, which can increase the transfer rate of photogenerated holes leading to a higher drain-to-source current. Therefore, a positive photo-response is observed under illumination. In contrast, when $V_{BG}>V_{Dirac}$, the electron becomes the dominant charge carrier in the graphene channel, leading to a negative photoresponse or current quenching. This is due to the recombination of transferred photogenerated holes and induced electrons by the back-gate electrode. Moreover, as the illumination intensity increases, the trapped photogenerated electrons in PQDs offer a more effective negative photogating effect by inducing more positive carriers in the graphene channel via capacitive coupling. This leads to the shift in the Dirac point toward a more-positive back-gate voltage. A graph 1400 photo-induced shift of $V_D$ at different intensities of monochromatic light (437 nm) is shown in FIG. 14.

Figure 12:
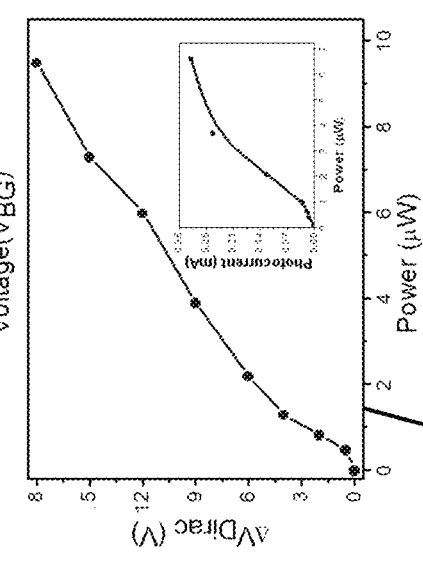
FIG. 12 is a graph showing shift of Dirac point as a function of incident light intensity in accordance with some embodiments.
Figure 15:
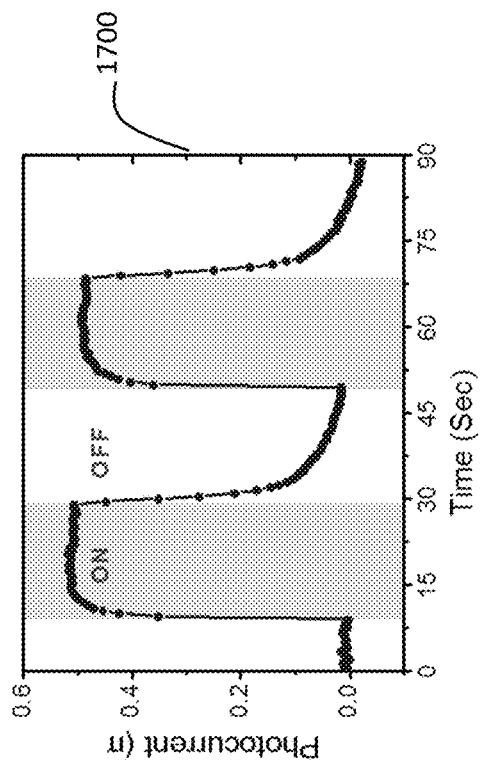
FIG. 15 is a schematic of a COMSOL simulation of PQDs of size 3 nanometers grown on a graphene film in accordance with some embodiments in accordance with some embodiments.
Figure 16:
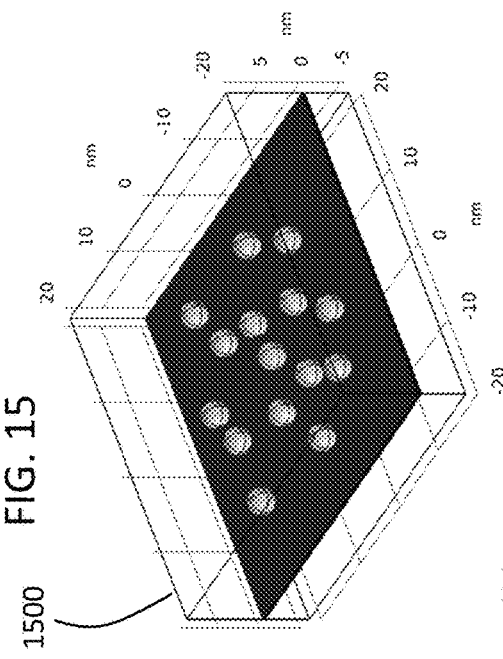
FIG. 16 is a graph of simulated photocurrent versus input power in accordance with some embodiments.

FIG. 12 shows a graph 1200 illustrating the shift of the Dirac point with incident power and the change of photocurrent ($I_{ph}=I_{light}-I_{dark}$) with respect to zero gate voltage at different light intensities. It is observed that the photocurrent increases as the incident photon power increases. As light intensity increases, more holes are generated and transferred to graphene, which induces a higher photogating effect and higher photocurrents. For bilayer films prepared by other deposition techniques on graphene for which there exists a thin space between the PQDs and the graphene film, the photocurrent response is much smaller than in the devices 500 comprising the G-PQD superstructure 400. To better understand the charge transfer effect, the photocurrent response was simulated using COMSOL. Two scenarios were compared: 1) PQDs just touching the graphene surface forming a bilayer configuration and 2) PQDs in close contact with the graphene film (i.e., considered as being inserted into the surface, grown from defect sites of graphene). The Fermi-Dirac semiconductor model is used to develop the G-PQDs model and continuous Fermi energy levels are used at the interface between the PQDs and the graphene film. To simplify the simulation, 40 nm×40 nm area of the graphene film (film thickness 0.3 nm) was used for all devices and a total of 15 PQDs were attached randomly on the graphene film to form the G-PQDs devices. The photocurrent effect was also simulated with two different PQDs sizes (3 nm and 5 nm) in the G-PQDs superstructure 400. A voltage of 1.5 μV was applied at the two ends of the film, and an incident plane wave with a wavelength of 430 nm is considered, as represented in graph 1500 of FIG. 15 and graph 1600 of FIG. 16, respectively. A photocurrent response close to zero was obtained from simulations for graphene films, even at different light intensities. For G-PQDs layers, the photocurrent was 0.3 pA under 150 nW illumination and 1.5 μV applied field. Among all the devices, the photocurrent responses of G-PQD devices 500 were the largest, which indicates that the charge transfer from the grown PQDs to the graphene film is much larger than for PQDs deposited on the graphene film. This shows that growing PQDs on graphene provides a direct conduction path for charge transfer, which agrees with the inventor's experimental results.

Figure 17:
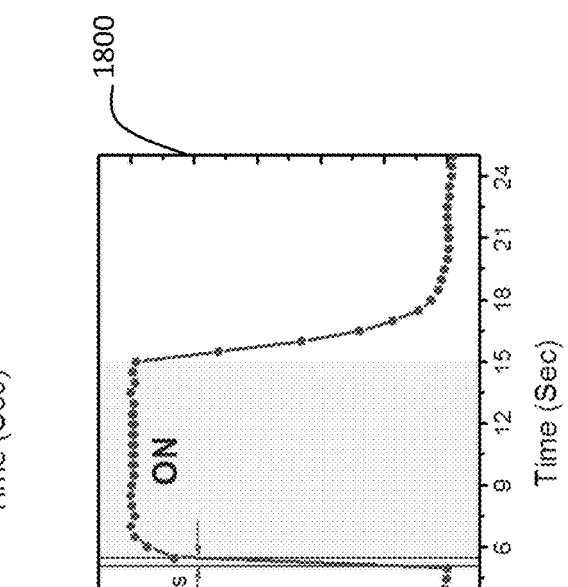
FIG. 17 is a graph of transient photo-response under light illumination on and off conditions in accordance with some embodiments.
Figure 18:
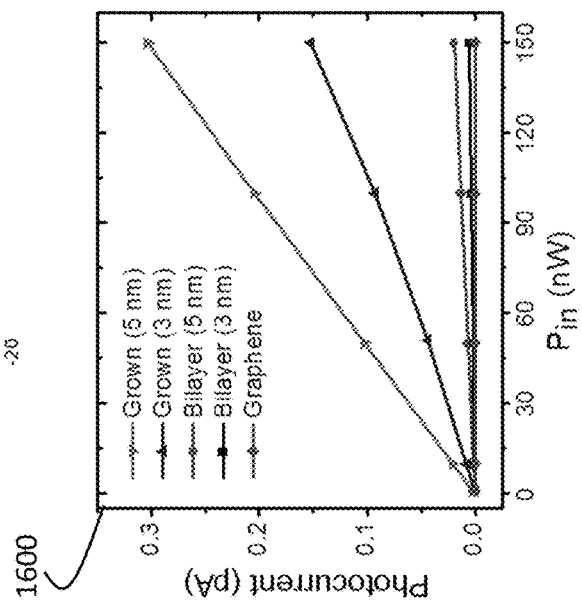
FIG. 18 is a graph of normalized photocurrent response to on/off illumination in accordance with some embodiments.

Next, the transient response of the G-PQD superstructure 400 was investigated. The transient photo-response of the G-PQDs superstructure 400 of one or more embodiments under periodic 33 mW/cm² white light illumination with on and off time of 20 seconds was investigated, as shown in the graph 1700 of FIG. 17. The results revealed a relatively fast and stable reproducible photo-response. A quick rise of photocurrent as soon as the light was turned on was followed by a drop back to initial values when light as turned off. This indicates that the a device 500 comprising the G-PQDs superstructure 400 can act as a light-activated switch. The response time for the photocurrent to rise up to 80% was about 0.45 s as shown in the graph 1800 of FIG. 18, which is comparable to the reported values in a graphene-perovskite structure. The photocurrent decay time was about 0.85 s for 50% decay from the maximum value. The longer response time was due to more complex factors, predominantly from the quantum capacitance of graphene and the time for relaxation charge transfer along ligands. Using this response time measurement, the photoconductive gain (G) can be calculated based on the equation:

$$G = \tau_{lifetime}/\tau_{transit} = \tau_{lifetime} \mu V/l^2 \quad (3)$$

where $\tau_{lifetime}$ is the lifetime of the photogenerated carriers and $\tau_{transit}$ is the duration of the carrier transport within the channel.

In one example, the photoconductive gain G was conducted using transistor mobility (μ) and applied drain-to-source voltage (V) of 0.5 V and a fixed channel length (l) of 15 μm. The calculated field effect mobility of pristine single layer graphene and the G-PQDs superstructure 400, in one implementation, are 2786 cm$^2$V$^{-1}$s$^{-1}$ and 2580 cm$^2$ V$^{-1}$s$^{-1}$, respectively. Therefore, the photoconductive gain of the G-PQDs superstructure 400, in at least one embodiment, varies between 1.8×10$^8$ and 1×10$^9$ for lifetimes of 0.29 s and 1.84 s, respectively. These values are very similar to the ones reported by Konstantatos et al. in hybrid graphene-PbS QDs phototransistor. See Konstantatos, G. et al. Hybrid graphene-quantum dot phototransistors with ultrahigh gain. Nat Nanotechnol 7, 363 (2012), which is hereby incorporated by reference in its entirety. The photoconductive gain can be further improved by increasing the carrier mobility of PQDs and by introducing shorter chain ligands. High photoconductive gain and responsivity can be attributed to the high charge carrier mobility of the graphene as well as the direct charge transfer pathway between the PQDs and the graphene layer.

Neuromorphic Photonic Synapses and Facial Recognition

Fast and stable photodetection property of the G-PQD superstructure 400 is observed when the gate voltage is maintained constant at 0 V. In some instances, Tuning the gate voltage towards positive direction can, however, limit the recombination of photogenerated carriers. Under light illumination, the gate tunable device can therefore achieve a higher conductance state which is retained even in the absence of light. This type of synaptic behavior, which is facilitated by gate tunability, is of great importance for neuromorphic computing.

In traditional von Neumann architecture, huge time and power spent in transporting data between memory and processor inevitably impose limitations in the performance and scalability of the structure, popularly known as the "von Neumann bottleneck". This major drawback leads to severe problems in data centric applications, such as real-time image recognition, data classification, and natural language processing. Neuromorphic computing has emerged as a superior platform for parallel energy efficient data processing with high accuracy and storage of information which outperforms the von-Neumann architecture.

Figure 19:
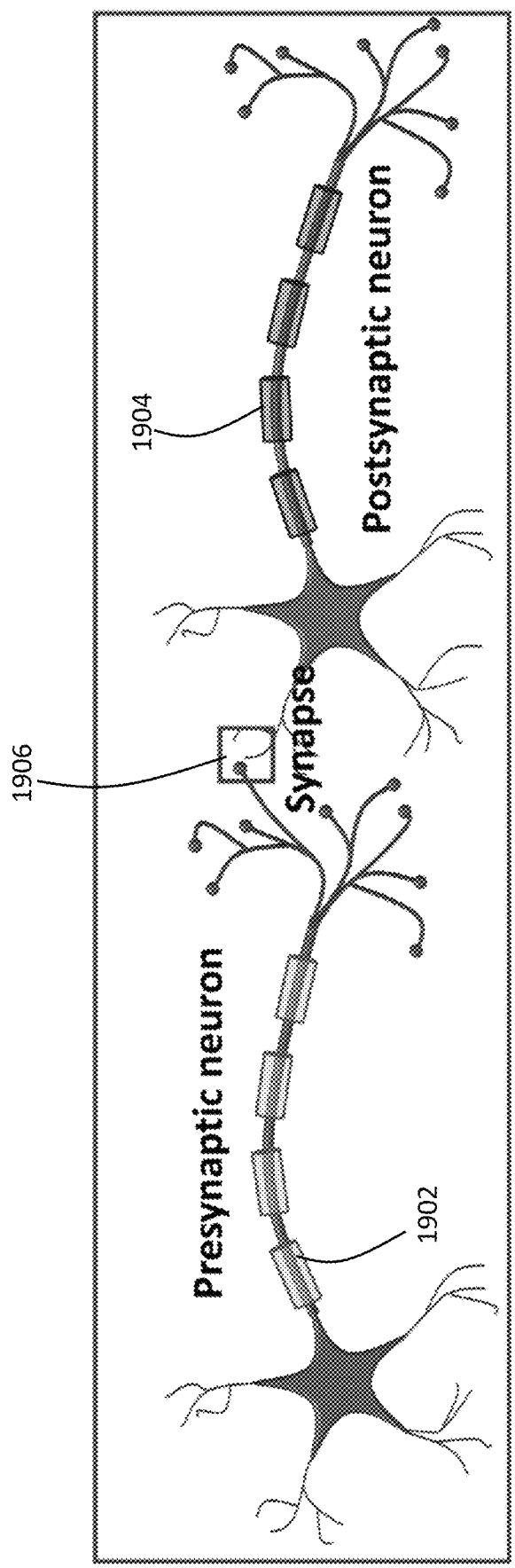
FIG. 19 shows the anatomy of two biological neurons connected via a biological synapse in accordance with some embodiments.
Figure 20:
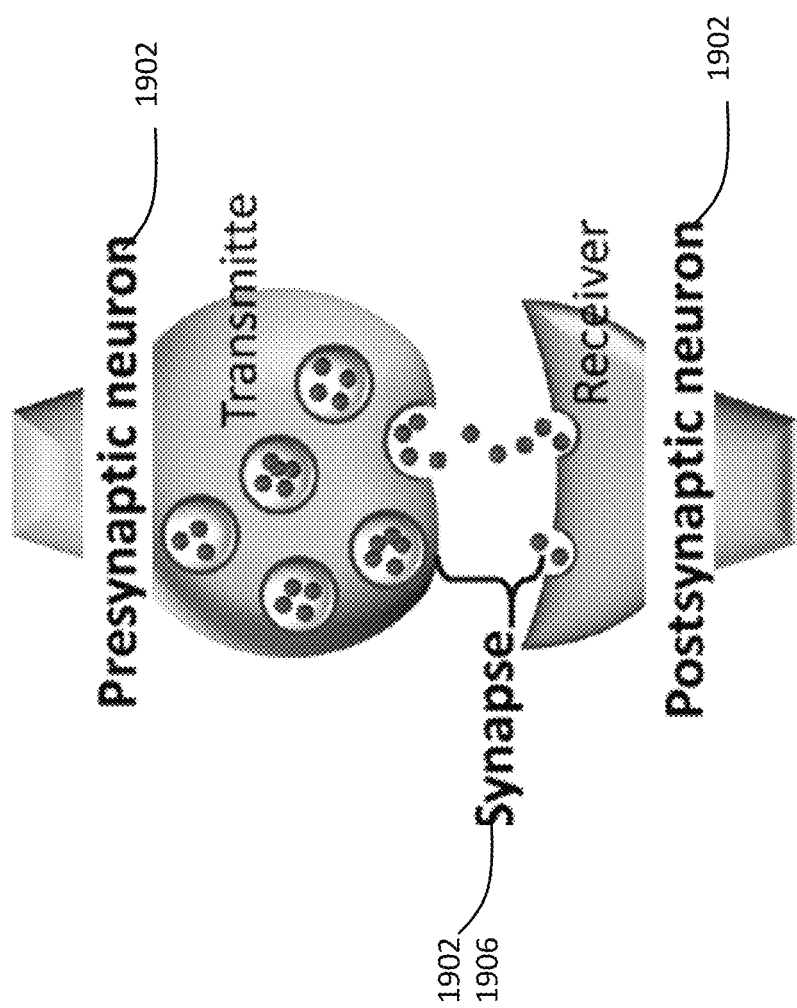
FIG. 20 is a schematic representation of a biological synapse in accordance with some embodiments.

FIG. 19 shows the anatomy of two biological neurons 1902, 1904 connected via a biological synapse 1906. As shown in FIG. 20, a synapse 1906 acts as a channel of communication between two neurons 1902, 1904. Information broadcasted from one neuron acting as presynaptic cell (transmitting neuron) 1902 is conveyed to the other acting as postsynaptic cell (receiving neuron) 1904 through a synapse 1906. The synaptic behavior can be strengthened (potentiated) or weakened (depressed) using appropriate triggers of optical pulses. Measurements of synaptic plasticity including short-term plasticity (STP), long term plasticity (LTP), and long-term depression (LTD) are emulated to resemble the synaptic behavior of its biological counterpart. In one or more embodiments, the G-PQD superstructure 400 acts as an artificial photonic synapse, where the presynaptic signal is the external light stimuli in the form of optical pulses and the postsynaptic signal is the current obtained across the G-PQD channel keeping both drain-source and gate voltage fixed.

To understand the synaptic dynamics of the device under different conditions of the presynaptic signal spikes, the change in conductance can be recorded for light (specific wavelength of 440 nm) that has different intensities varying from 190 nW/cm$^2$ to 1.1 μW/cm$^2$ (see FIG. 5c of USPPA '835). Conductance of a device 500 comprising the G-PQD superstructure 400 changes under the application of light when voltage biases are applied to the gate (10 V)/drain (0.5 V) electrodes of the device 500, while the source electrode is kept grounded. Higher level of conductance is achieved for light of highest intensity (1.1 μW/cm$^2$) as compared to the other intensities. At high intensity, enhancement in the conductance state is attributed to the formation of more photogenerated carriers. The effect of paired pulse facilitation (PPF), a special case of STP due to two closely spaced light pulses is shown in FIG. 5d of USPPA '835 (also see FIGs. S7 and S8 of USPPA '835). Normalized conductance of the device for a varying number of pulses at a fixed wavelength of 440 nm with an intensity of 1.1 μW/cm$^2$ is shown in FIG. 5e of USPPA '835 (also see FIG. S9 of USPPA '835). The normalized conductance attains a value of ~1.11 for one pulse and gradually increases as the number of pulses increases.

Figure 21:
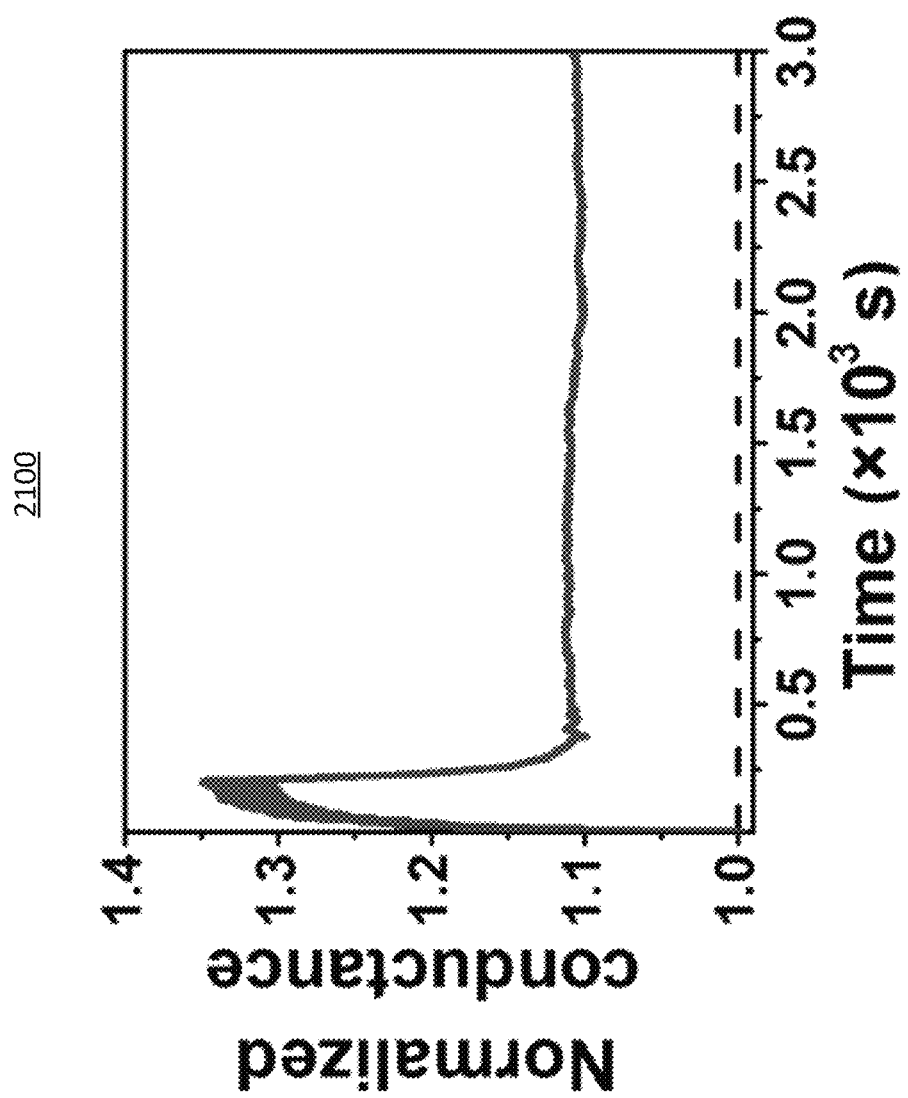
FIG. 21 is a graph showing retention of long-term potentiated device ($V_D$=0.5 V and $V_G$=10 V) for 3×10's after application of 20 optical pulses (on time of 5 seconds and an off time of 5 seconds) in accordance with some embodiments.
Figure 22:
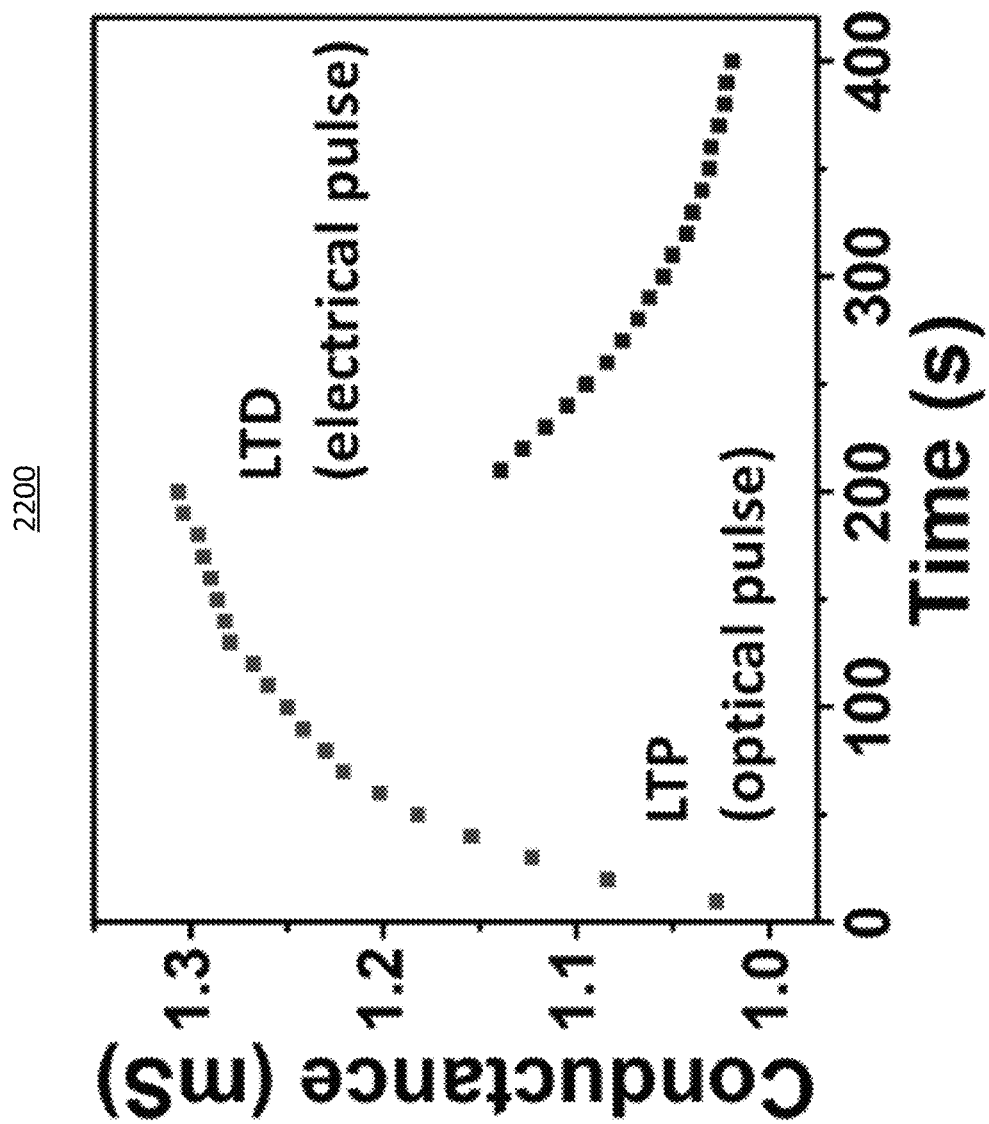
FIG. 22 is a graph showing nonvolatile synaptic plasticity of the device ($V_G$=10 V) showing LTP by train of optical pulses (on/off time of 5 s/5 s) at $V_D$ 0.5 V and LTD by a train of electrical pulses (−0.5 V, on/off time of 1 s/1 s) at $V_D$; in accordance with some embodiments.

FIG. 21 shows a graph 21 illustrating the variation in normalized conductance triggered by 20 pre-synaptic light spikes under a gate bias of 10 V. A change in conductance is obtained under application of light pulses, which does not relax to its initial stage even when the light is switched off. LTP is induced in the device 500 comprising the G-PQD superstructure 400, which is sustained for 3000 seconds. LTP obtained by applying photonic pulses followed by LTD obtained by applying electrical pulses at drain is demonstrated in the graph 2200 of FIG. 22. This clearly shows the non-volatile synaptic plasticity of a device 500 comprising the G-PQD superstructure 400. Negative pulses at drain helps in depressing the potentiated device by de-trapping the photo-generated carriers in the PQDs. This shows the non-volatile synaptic plasticity of our device. We find that negative pulses at drain help in depressing the potentiated device by detrapping the photogenerated carriers in the PQDs. The synaptic device shows paired pulse depression (PPD) of 99.03%, which is the percentage change in conductance of the second spike with respect to the first spike due to the application of the electrical pulses. PPD is observed when the first postsynaptic current (or postsynaptic conductance) is large, followed by a spike whose amplitude is less than the first and implies the inhibitory signal transmission. This contrasts with PPF, which is observed when the first postsynaptic current (or postsynaptic conductance) is small, and the second is larger than the first, which is based on excitatory signal transmission.

Figure 23:
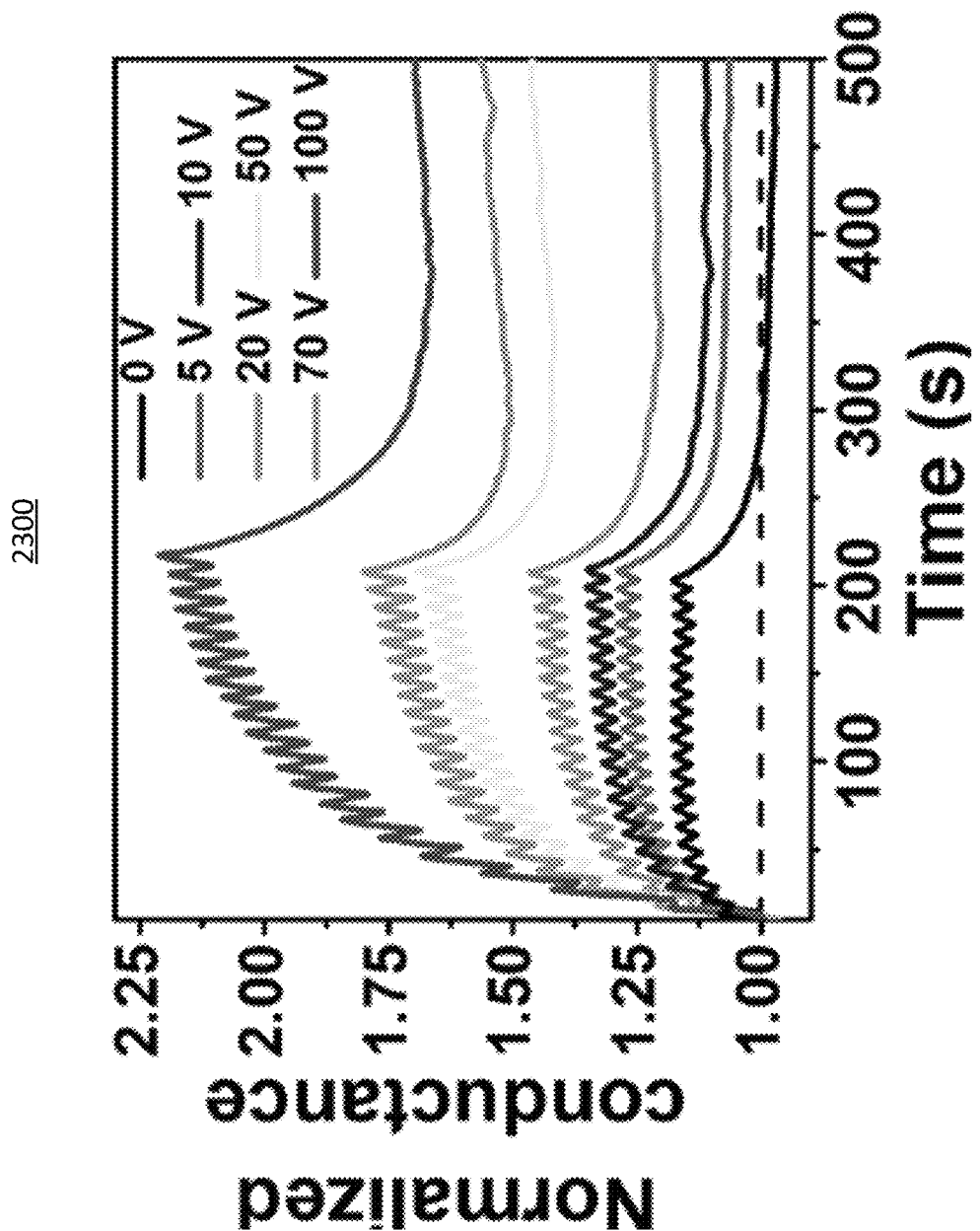
FIG. 23 is a graph showing gate dependent transient characteristic of the device ($V_D$=0.5 V) after application of 20 optical pulses (on/off time of 5 s/5 s) in accordance with some embodiments.

Gate dependent LTP is also observed, as shown in the graph 2300 of FIG. 23, by increasing the gate bias. It is seen that both enhancement in conductance due to photo-generated carriers under illumination and capability of retention after removal of light increases as the gate becomes more positive. When gate voltage moves in the positive regime, electrons get trapped in the trap centers in graphene. These trapped charges lead to quasi p-doping of graphene. The higher the gate voltage, the larger the quasi p-doping of graphene. Under illumination, photogenerated holes are injected into the graphene from the PQDs, which contribute to the gain of photocurrent (or conductance) as holes are injected in a p-doped channel. This explains the jump in the conductance from the initial point to the final point, and this effect is emphasized when gate becomes more positive (holes being injected in the p" channel). Moreover, the photogenerated holes injected into graphene cannot recombine with the electrons as the electrons are trapped even when the light is switched off because of positive gate voltage. The holes continue to flow in the system under the effect of drain voltage and maintain retention over a long time, resulting in LTP of the device. The energy consumption per synaptic event of optically stimulated synaptic devices is calculated using $$dE = S \times P \times dt \qquad (4),$$

where S is the area of the device and P is the power density of the input light at a spike duration of t.

The calculation for a device 500 comprising the G-PQD superstructure 400, of at least one embodiment, indicates that the energy consumption per synaptic event for potentiation is 36.75 pJ for the optimized spike duration of 5 seconds. The energy consumption per synaptic event was calculated for devices showing photonic synaptic behavior reported in the literature and compared them with the value obtained for these devices 500. A G-PQD synaptic device 500 of one or more embodiments, showed lower energy consumption with respect to the energy consumption calculated using the data of other similar devices given in the literature.

Figure 24:
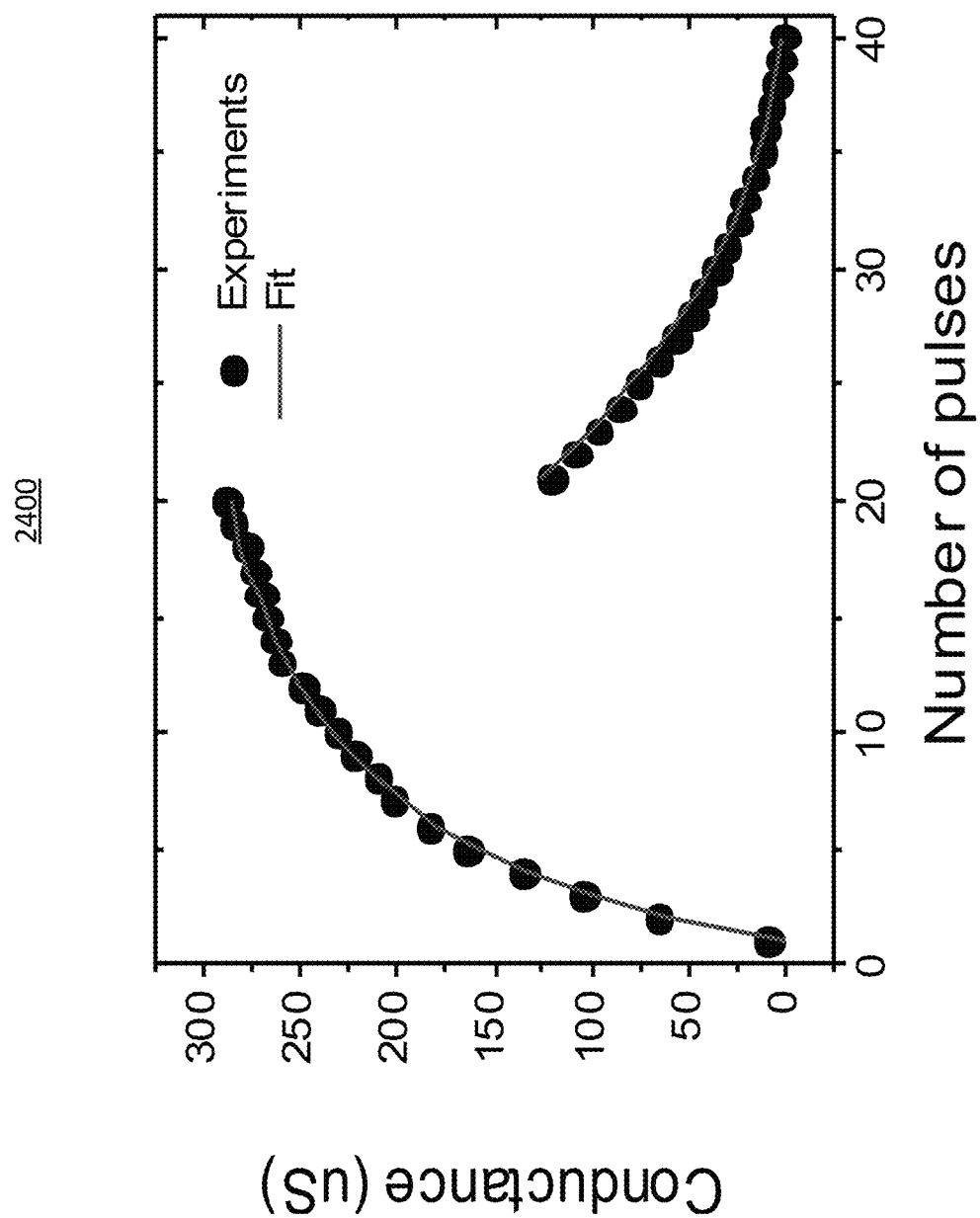
FIG. 24 is a graph of fitted conductance change with pulse number of our synapse of the G-PQD synaptic device in accordance with some embodiments.

With the integrated optical information detection, processing, and retention capabilities of the G-PQD synaptic devices 500, they become a potential candidate for human visual memory and in fields of pattern recognition. For real pattern recognition application, a dark current is chosen as a baseline. The fitted conductance curve of the device is shown in the graph 2400 of FIG. 24 and the fitting parameters are shown in Table 1 below:

TABLE 1

| | a | b | c | Gmax (uS) | Gmin (uS) |
|---|---|---|---|---|---|
| Potentiation | −28.98866 | 87.6852 | 1.03342 | 288 | 0.01 |
| Depression | 17.05051 | −1.04423 | −2.70541 | 288 | 0.01 |

For the optical synapses, both optical and electrical spikes, in at least some embodiments, are used to change the conductance. These fitting parameters are important because they represent how a synaptic weight changes inside of the neuron network when training the network. For optical synapses of one or more embodiments, both optical and electrical spikes were used to change the conductance.

Using the fitted conductance properties of the device 500, a spiking neural network can be constructed to perform unsupervised machine learning and face recognition. Portraits from a given number of people, such as 4 people, can be used to train the neural network and different portraits can be used for testing. In one embodiment, the light intensity and the face angle can be varied in order to a have testing dataset that has different images from the training set see, FIG. S10 of USPPA '835). In one embodiment, the input neuron size is based on the total pixels of one portrait. For example, for a portrait of MNIST image having a size of m pixels by n pixels the input neuron size can be the product of m×n. In this example, the output neuron size can be set to a size that ensures good accuracy. For example, for a portrait having a size of 100×70 pixels the input neuron size can be 7000. In this example, the output neuron size can be 10 in order to have good accuracy. In another example, for the MNIST dataset the input neuron size can be 784 (28×28) and the output neuron size can be 64.

Figure 25:
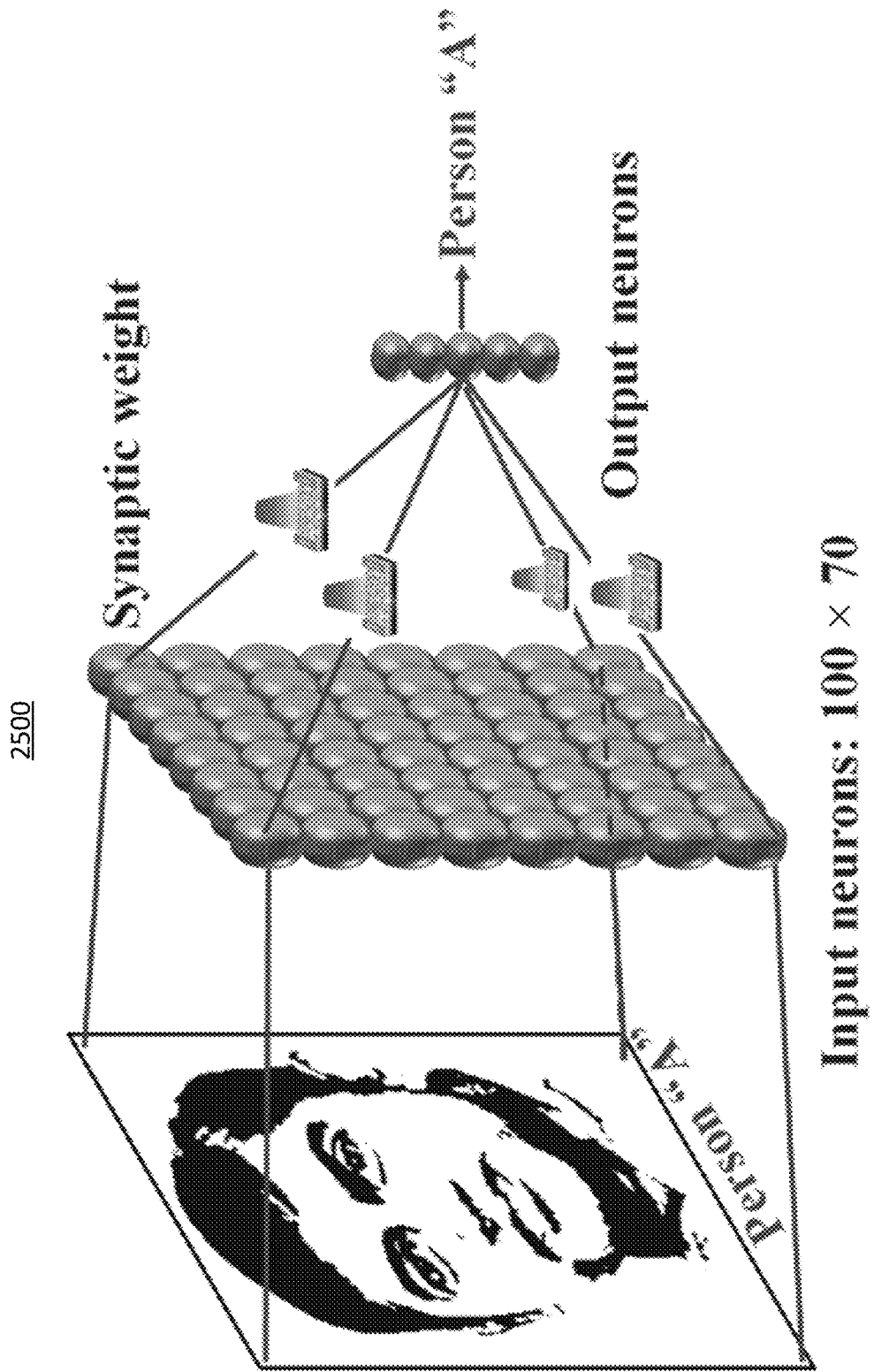
FIG. 25 is a schematic of neuron network structure for face recognition comprising the G-PQD synaptic device in accordance with some embodiments.
Figure 26:
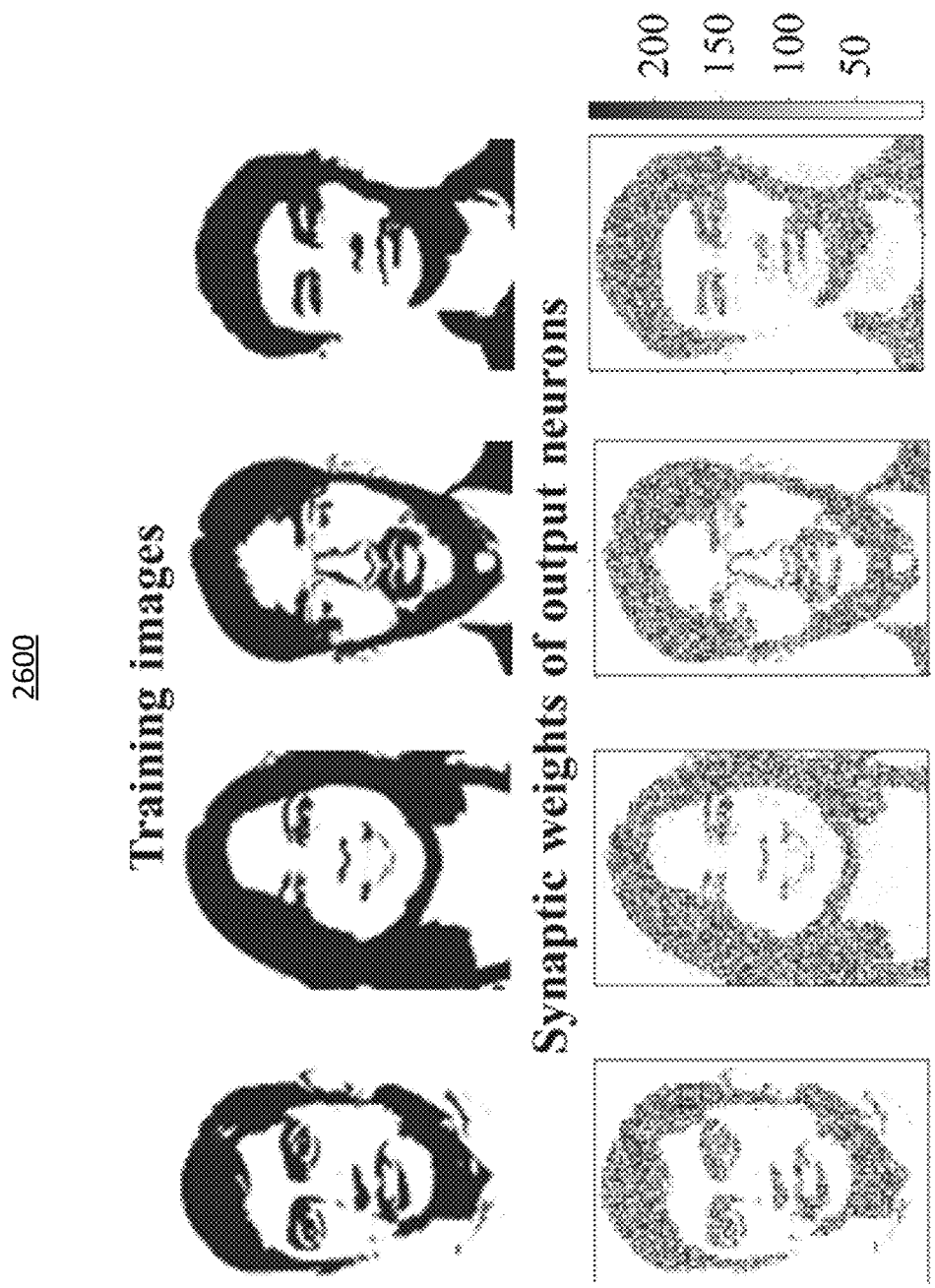
FIG. 26 are pictures of real images (upper part) for training and the synaptic weights of certain corresponding output neurons (lower part) of the G-PQD synaptic device in accordance with some embodiments.
Figure 27:
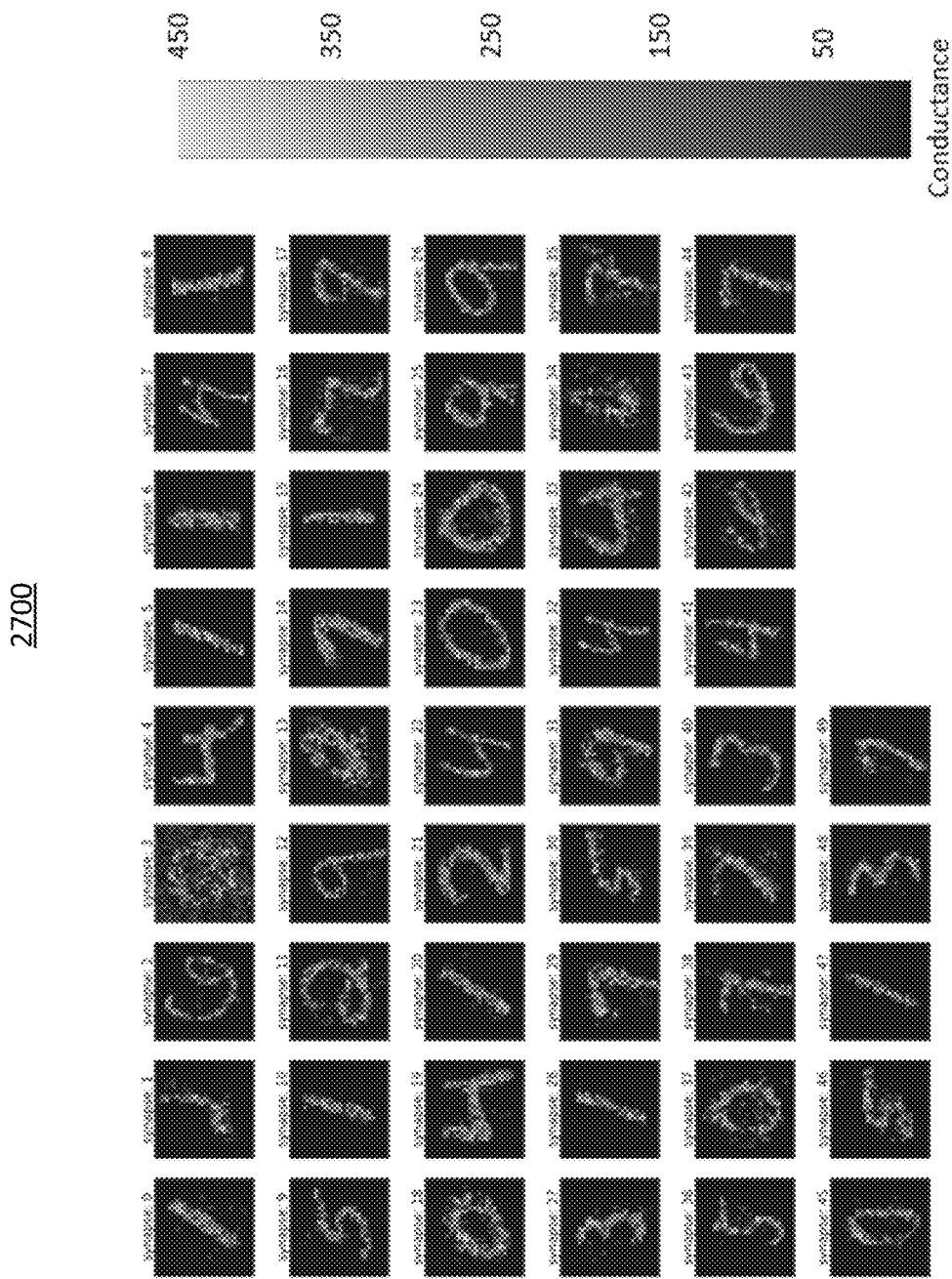
FIG. 27 illustrates synaptic weights of each output neurons from a training of MNIST dataset in accordance with some embodiments.

The network structure 2500 is shown in FIG. 25. In one embodiment, each presynaptic neuron senses each pixel of the input images and transforms them into presynaptic spikes. After the synaptic devices, the post synaptic signals are summed at the postsynaptic neuron, which could make it spike. FIG. 26 displays examples of real images 2600 that can be used for training and the synaptic weights of some corresponding output neurons, which shows the pattern recognition ability of this unsupervised spiking neural network with the device properties of one or more embodiment. By comparing the upper images (real images used for training) and the bottom images (synaptic weights of the corresponding output neurons), it is clear that the synapses of one or more embodiments catch the features from the portraits and can realize facial recognition very well. In addition, to further detect the learning ability of the photonic synapses of one or more embodiments, 1000 figures from MNIST dataset were chosen for training and 1000 different figures from the same dataset were chosen for testing. For real applications, if more output neurons are adapted and longer training time is used, higher recognition rates can be achieved. FIG. 27 shows results 2700 of MNIST dataset recognition performed by the device 500 utilizing the example parameters provided above. For example, FIG. 27 shows the synaptic weights of each output neurons, where the accuracy is around 44.1% after 10 epochs.

For synapses of one or more embodiments, both optical and electrical signals can be used to change the conductance of the device. Add-on sensors can sense the external environmental signals and then transform them to presynaptic spikes. The postsynaptic current is integrated by output neurons. Once the summed postsynaptic current is beyond the threshold, the output neuron spikes and this signal goes back to the synapse to adjust its property with the input presynaptic spike. An increase or decrease of the device conductance is fitted by:

$$\Delta G = a_p + b_p e^{-c_p \frac{G - G_{min}}{G_{max} - G_{min}}}, \qquad (6)$$

$$\Delta G = a_d + b_d e^{-c_d \frac{G_{max} - G}{G_{max} - G_{min}}}. \qquad (7)$$

However, in real biological system, the weight change of the synapse is also related to the time interval between the pre and post synaptic spikes. In one embodiment, the simplified STDP learning rule can be considered without considering the time interval effect, which makes the neuron circuits easier to develop.

Neurons are leaky integrate-and-fire types, which integrate postsynaptic currents and spike once the currents reach the threshold. The characteristic can be modeled by a simple equation:

$$\frac{dV}{dt} = \frac{I_{post} - GV}{\tau}, \qquad (8)$$

where $\tau$ is a time constant, V is the state variable (voltage) of the neuron and $I_{post}$ is the summed post synaptic current which goes into the output neuron. In addition, to mimic the homeostasis inside of biological system, the following equation is included in the simulation for output neurons:

$$\frac{dV_{th}}{dt} = \gamma(A - T), \qquad (9)$$

where A is the mean firing rate of a neuron, T is the target firing rate and $\gamma$ is a constant. The role of homeostasis is to adjust the thresholds of neurons. The meaning of the homeostasis is to adjust the thresholds of neurons. If the mean fire rate of the neuron is above the target, the threshold of this neuron will increase. This is to make sure all the output neurons are used and make each one specialized for the stimuli.

Under light (pre-synaptic) exposure, the synaptic device 500 of one or more embodiments, can mimic light-facilitated synaptic functions by changing the level of conductance at the drain (post-synaptic). The change in the conductance level as a function of photonic pulses is directly proportional to the synaptic weight of the device 500 and the ability to change the level implies synaptic plasticity. Synaptic plasticity is classified as short term and long term based on a temporal or persistent change in the synaptic strength. When the photogenerated carriers from the first light spike, before recombination, are appended with those originating from the second light spike resulting in an increase in the device conductance. PPF index is calculated from the change in conductance (or current) due to two consecutive pulses and shows the signature of short term plasticity. When the device is triggered with repetitive training pulses, the learning effect of the device 500 can be enhanced by modifying the synaptic weight through off-time between the pulses and number of pulses.

The effect of (a) number of pulses and (b) delay between the pulses on the device conductance is exponential in both cases except for the number of pulses causing an exponential rise and the delay causing an exponential decay. It becomes important to correlate the optimized off time between consecutive pulses (5 seconds in this case) along with the number of pulses (20 pulses in this case) in order to maximize conductance state.

General Background on Semiconductor Devices

It is to be understood that the various layers and/or regions shown in the accompanying drawings are not drawn to scale, and that one or more layers and/or regions of a type commonly used in field effect transistors and metal-oxide semiconductor (MOS) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with various embodiments of the present invention may be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

As used herein, "vertical" refers to a direction perpendicular to a substrate in the views herein. As used herein, "horizontal" refers to a direction parallel to a substrate views herein. As used herein, "thickness" refers to a size of an element (e.g., a layer, trench, hole, etc.) in the cross-sectional views measured from a bottom surface to a top surface, or a left side surface to a right side surface of the element, and/or measured with respect to a surface on which the element is directly on.

Unless otherwise specified, as used herein, "height" or "height above a substrate" refers to a vertical size of an element (e.g., a layer, trench, hole, etc.) in the cross-sectional views measured from a top surface of the substrate to a top surface of the element. A thickness of an element can be equal to a height of the element if the element is directly on the substrate. As used herein, "lateral", "lateral side", and "lateral surface", and the like, refer to a side surface of an element (e.g., a layer, an opening, a fin, etc.), such as a left or right side surface in the cross-sectional views herein.

As used herein, the terms "width" or "width value", and the like, refer to a distance from a start point on a first structure to an end point on the same structure, in a critical dimension. There can be specified a vertical width (e.g., a thickness) of the structure or a horizontal width of the structure.

It will also be understood that when an element such as a layer, region or substrate is referred to as being "on" or "over" another element, it can be directly on the other element or intervening elements may also be present. Similar but inverse meaning will be understood for an element such as a layer, region, or substrate that is referred to as being "under" or "below" another element. It can be directly under the other element or intervening elements may also be present. In contrast, when an element is referred to as being "directly on" or "directly over", or alternatively referred to as being "directly under" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be by any process that grows, coats, or otherwise transfers a material onto the wafer. Available technologies include, for example, physical vapor deposition (PVD), chemical vapor deposition (CVD), electrochemical deposition (ECD), molecular beam epitaxy (MBE) and more recently, atomic layer deposition (ALD) among others.

The terms "epitaxially growing", "epitaxial growth", "epitaxially grown", and their variants, mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a combination thereof, and/or the like. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

Removal may be by any process that removes material from the wafer; examples include etch processes (either wet or dry), reactive ion etching (RIE), and chemical-mechanical planarization (CMP).

Patterning refers to the shaping or altering of deposited materials and can be generally referred to as lithography by applying a patterned mask. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist can be removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

Non-Limiting Examples

Although specific embodiments of the invention have been discussed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method for operating a light control phototransistor device as an artificial photonic synapse, the method comprising:
   applying a first fixed voltage to a gate of a phototransistor and a second fixed voltage across a graphene source-drain channel comprising a perovskite quantum dot layer formed thereon, wherein the perovskite quantum dot layer is a methylammonium lead bromide material;
   applying a presynaptic signal as stimuli across the graphene source-drain channel, the presynaptic signal comprising one or more pulses of light; and
   measuring a current across the graphene source-drain channel to represent a postsynaptic signal.

2. The method of claim 1, wherein the applying the presynaptic signal as stimuli across the graphene source-drain channel comprises:
   applying one or more pulses at a first intensity while keeping a frequency of the one or more pulses at a given rate, and wherein the current measured across the graphene source-drain channel is a first current value.

3. The method of claim 2, wherein the applying the presynaptic signal as stimuli across the graphene source-drain channel comprises:
   applying one or more pulses at a second intensity while keeping a frequency of the one or more pulses at the given rate, wherein the current measured across the graphene source-drain channel is a second current value,
   wherein the second intensity is greater than the first intensity and the second current value is higher than the first current value.

4. The method of claim 1, wherein the applying the presynaptic signal as stimuli across the graphene source-drain channel comprises:
   applying one or more pulses at a first frequency while keeping an intensity of the pulses at a given value and at a given wavelength of light,
   wherein the current measured across the graphene source-drain channel is a first current value.

5. The method of claim 4, wherein the applying the presynaptic signal as stimuli across the graphene source-drain channel comprises:
   applying one or more pulses at a second frequency while keeping an intensity of the pulses at the given value and at the given wavelength of light,
   wherein the current measured across the graphene source-drain channel is a second current value, and
   wherein the second frequency is greater than the first frequency and the second current value is higher than the first current value.

6. The method of claim 1, wherein the applying the presynaptic signal as stimuli across the graphene source-drain channel comprises:
   applying one or more pulses at a frequency while keeping an intensity of the pulses at a given value and at a given wavelength for a period of time until the current measured across the graphene source-drain channel is at constant current value representing a state of long-term plasticity;
   applying one or more light pulses to a drain of the graphene source-drain channel and measuring an increase in the current across the graphene source-drain channel representing a state of long-term potentiation; and
   applying voltage pluses to a drain of the graphene source-drain channel and measuring decrease in the current across the graphene source-drain channel representing long-term depression (LTD).

7. The method of claim 1, further comprising:
   tuning a gate voltage of the phototransistor to increase a conducting state of the phototransistor under light illumination across the graphene source-drain channel.

8. The method of claim 1, further comprising:
   using simplified spike-timing-dependent plasticity to perform unsupervised machine learning for pattern recognition.

9. A phototransistor device to act as an artificial photonic synapse comprising:
   a substrate;
   a graphene source-drain channel patterned on the substrate; and
   a grown perovskite quantum dot layer formed from a chemical structure of a graphene layer of the graphene source-drain channel, wherein the grown perovskite quantum dot layer is situated between the graphene source-drain channel as an active layer.

10. The phototransistor device of claim 9, wherein the grown perovskite quantum dot layer is methylammonium lead bromide material.

11. The phototransistor device of claim 9, further comprising:
    a silicon dioxide layer formed on a top surface of the substrate.

12. The phototransistor device of claim 11, wherein the graphene source-drain channel is disposed on and in contact with the silicon dioxide layer.

13. The phototransistor device of claim 11, wherein the grown perovskite quantum dot layer is disposed on and in contact with the silicon dioxide layer.

14. The phototransistor device of claim 9, wherein the grown perovskite quantum dot layer is disposed between a source and a drain of the graphene source-drain channel.

15. The phototransistor device of claim 9, wherein the grown perovskite quantum dot layer comprises a plurality of perovskite quantum dots including a first set of perovskite quantum dots having a first size and a second set of perovskite quantum dots having a second size different from the first size.

16. The phototransistor device of claim 9, wherein a graphene material of the graphene source-drain channel is formed on and in contact with the substrate.

17. The phototransistor device of claim 16, wherein the substrate comprises a silicon dioxide layer, and wherein the graphene material of the graphene source-drain channel is formed on and in contact with the silicon dioxide layer.

18. A method for forming a phototransistor device, the method comprising:
    forming a graphene layer on a substrate;
    forming a source and a drain on the substrate, wherein the graphene layer forms a graphene channel between the source and the drain; and
    growing perovskite quantum dots comprising Methylammonium lead bromide from a chemical structure of the graphene channel.

19. The method of claim 18, wherein growing the perovskite quantum dots comprises:
    wetting the graphene channel with a precursor comprising Methylammonium lead bromide.

20. The method of claim 19, wherein growing the perovskite quantum dots further comprises:
    applying an anti-solvent to precursor.

* * * * *